United States Patent
Tsao et al.

(10) Patent No.: US 11,004,858 B2
(45) Date of Patent: May 11, 2021

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Tsun-Kai Tsao, Tainan (TW); Hung-Ling Shih, Tainan (TW); Po-Wei Liu, Tainan (TW); Shun-Shing Yang, Tainan (TW); Wen-Tuo Huang, Tainan (TW); Yong-Shiuan Tsair, Tainan (TW); S. K. Yang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 4 days.

(21) Appl. No.: 16/370,736

(22) Filed: Mar. 29, 2019

(65) Prior Publication Data
US 2019/0229123 A1 Jul. 25, 2019

Related U.S. Application Data

(60) Continuation of application No. 15/914,485, filed on Mar. 7, 2018, now Pat. No. 10,269,818, which is a (Continued)

(51) Int. Cl.
*H01L 27/11529* (2017.01)
*H01L 21/28* (2006.01)
(Continued)

(52) U.S. Cl.
CPC .. *H01L 27/11529* (2013.01); *H01L 21/31056* (2013.01); *H01L 27/11521* (2013.01); *H01L 29/40114* (2019.08); *H01L 29/42328* (2013.01)

(58) Field of Classification Search
None
See application file for complete search history.

(56) References Cited

U.S. PATENT DOCUMENTS 9,276,006 B1   3/2016  Chen et al.
9,917,165 B2 * 3/2018  Wu .................. H01L 29/788
(Continued)

FOREIGN PATENT DOCUMENTS

CN   104051348 A   9/2014
CN   104952479 A   9/2015
(Continued)

OTHER PUBLICATIONS

Office Action German Patent Application No. 10 2016 119 019.5 dated Mar. 16, 2017.
(Continued)

*Primary Examiner* — Michelle Mandala
(74) *Attorney, Agent, or Firm* — McDermott Will & Emery LLP

(57) ABSTRACT

A semiconductor device includes a non-volatile memory and a logic circuit. The non-volatile memory includes a stacked structure comprising a first insulating layer, a floating gate, a second insulating layer, a control gate and a third insulating layer stacked in this order from a substrate; an erase gate line; and a word line. The logic circuit includes a field effect transistor comprising a gate electrode. The word line includes a protrusion, and a height of the protrusion from the substrate is higher than a height of the erase gate line from the substrate. The word line and the gate electrode are formed of polysilicon.

20 Claims, 29 Drawing Sheets

Related U.S. Application Data division of application No. 15/209,370, filed on Jul. 13, 2016, now Pat. No. 9,929,167.

(51) Int. Cl.
*H01L 29/423* (2006.01)
*H01L 27/11521* (2017.01)
*H01L 21/3105* (2006.01)

(56) References Cited

U.S. PATENT DOCUMENTS

| | | |
|---|---|---|
| 2008/0227254 A1 | 9/2008 | Rao et al. |
| 2009/0052250 A1* | 2/2009 | Kawashima ...... H01L 29/40117 365/185.13 |
| 2014/0264538 A1 | 9/2014 | Yu et al. |
| 2015/0280004 A1 | 10/2015 | Wu et al. |
| 2016/0013195 A1* | 1/2016 | Tsao .................. H01L 29/66825 257/316 |
| 2016/0013198 A1 | 1/2016 | Liu |
| 2016/0163722 A1 | 6/2016 | Chang et al. |
| 2016/0163876 A1 | 6/2016 | Wu et al. |
| 2016/0172367 A1 | 6/2016 | Shih et al. |
| 2016/0181266 A1 | 6/2016 | Chuang et al. |
| 2016/0190268 A1 | 6/2016 | Wu et al. |
| 2016/0225777 A1* | 8/2016 | Cheng ............... H01L 29/66825 |
| 2016/0358928 A1* | 12/2016 | Wu ....................... H01L 29/7881 |
| 2017/0125432 A1 | 5/2017 | Richter et al. |

FOREIGN PATENT DOCUMENTS

| | | |
|---|---|---|
| CN | 105655338 A | 6/2016 |
| KR | 10-2000-0013940 A | 3/2000 |
| KR | 10-2009-0128413 A | 12/2009 |
| TW | 201603244 A | 1/2016 |
| TW | 201621988 A | 6/2016 |

OTHER PUBLICATIONS

Korean Office Action Application No. 10-2016-0135907 dated Jan. 15, 2018.
Office Action issued in U.S. Appl. No. 15/209,370, dated Jun. 22, 2017.
Notice of Allowance issued in U.S. Appl. No. 15/209,370, dated Nov. 16, 2017.
Taiwanese Office Action issued in corresponding Taiwanese Patent Application No. 106123440, dated Mar. 8, 2018.
Office Action issued in related U.S. Appl. No. 15/914,485, dated Aug. 8, 2018.
Notice of Allowance issued in related U.S. Appl. No. 15/914,485, dated Jan. 3, 2019.

* cited by examiner

SEMICONDUCTOR DEVICE AND MANUFACTURING METHOD THEREOF

RELATED APPLICATIONS

This application is a continuation of U.S. patent application Ser. No. 15/914,485, filed Mar. 7, 2018, which is a division of U.S. patent application Ser. No. 15/209,370, filed Jul. 13, 2016, the entire contents of which applications are incorporated herein by reference.

TECHNICAL FIELD

The disclosure relates to semiconductor integrated circuits, more particularly to semiconductor devices including non-volatile memory cells and manufacturing processes thereof.

BACKGROUND

As the semiconductor industry introduces new generations of integrated circuits (ICs) having higher performance and greater functionality, cost reduction pressure becomes stronger. In particular, reducing a number of lithography processes has been required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1A:
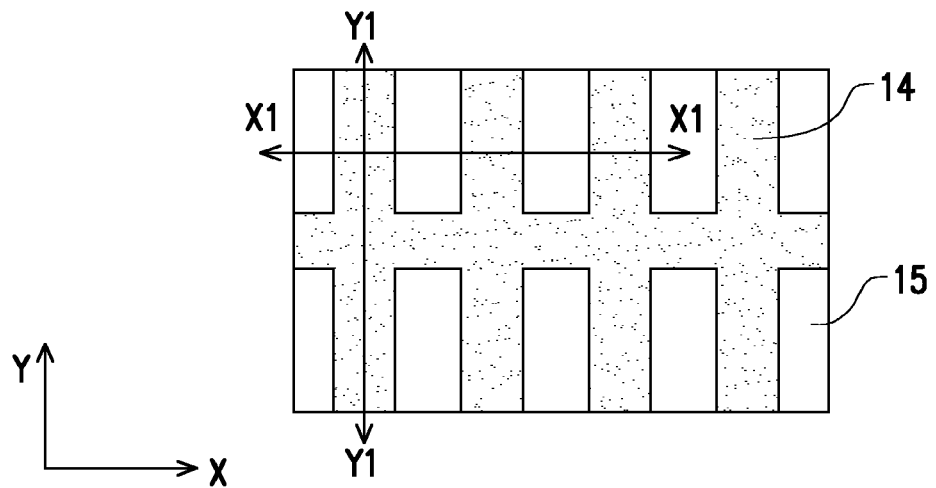
FIGS. 1A-11C show exemplary views illustrating sequential processes for manufacturing a non-volatile memory according to one embodiment of the present disclosure.

FIGS. 1A-11C show exemplary views illustrating sequential processes for manufacturing a non-volatile memory according to one embodiment of the present disclosure. FIGS. 1A, 2A, . . . and 11A show plan view (views from the above), FIGS. 1B, 2B, . . . and 11B show cross sectional views along line X1-X1 in FIGS. 1A, 2A, . . . and 11A, and FIGS. 1C, 2C, . . . and 11C show cross sectional views along line Y1-Y1 in FIGS. 1A, 2A, . . . and 11A. It is understood that additional operations can be provided before, during, and after processes shown by FIGS. 1A-11C, and some of the operations described below can be replaced or eliminated, for additional embodiments of the method. The order of the operations/processes may be interchangeable.

Figure 1B:
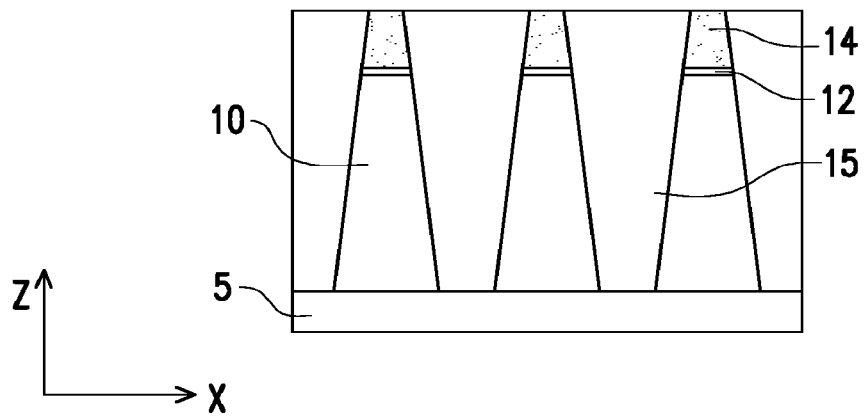
Figure 1C:
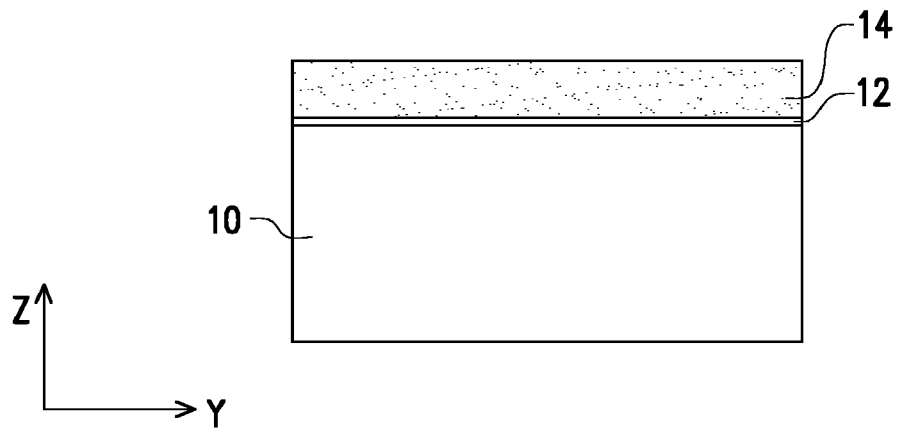
Figure 2A:
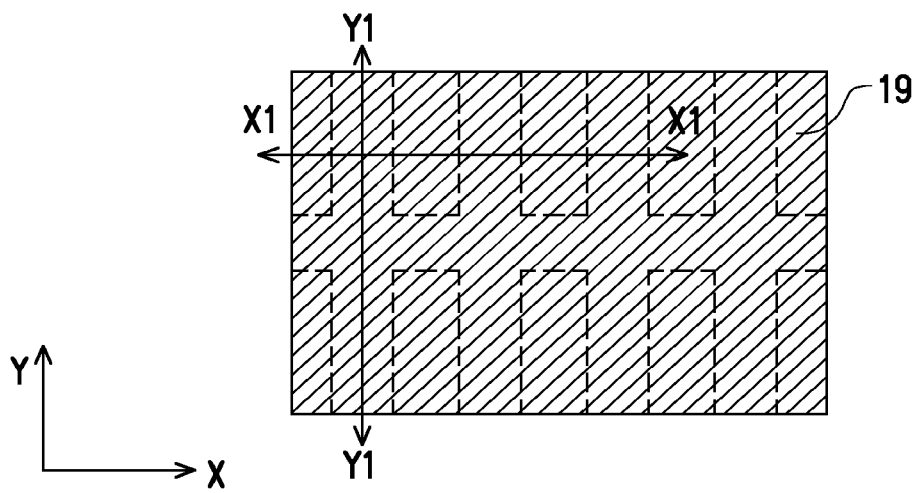

FIGS. 1A-1C show a structure of a non-volatile memory area after an isolation insulating layer 15, which is called shallow trench isolation (STI) is formed. A mask layer including a silicon oxide layer 12 and a silicon nitride layer 14 is formed on a substrate 5. The silicon oxide layer 12 is formed by thermal oxidization or chemical vapor deposition (CVD), and the silicon nitride layer 14 is formed by CVD. A thickness of the silicon oxide layer 12 is in a range from about 7 nm to 10 nm, and a thickness of the silicon nitride layer 14 is in a range from about 40 nm to 200 nm, in some embodiments. The substrate 5 is silicon in one embodiment. Other semiconductor materials such as SiGe, SiC, a group III-V semiconductor may be used as the substrate 5. After the mask layer is formed, the mask layer is patterned by lithography and etching operations. Then, by using the patterned mask layer as an etching mask, the substrate 5 is trench-etched to form trenches. A depth of the trenches is in a range from about 100 nm to about 1 µm in some embodiments.

The trenches are filled with an insulating (dielectric) material 15. One or more layers of insulating materials such as silicon oxide, silicon oxynitride or silicon nitride, are formed by LPCVD (low pressure chemical vapor deposition), plasma-CVD or flowable CVD. The insulating material layer may be formed by one or more layers of spin-on-glass (SOG), SiO, SiON, SiOCN and/or fluorine-doped silicate glass (FSG). After forming the insulating material layer, a planarization operation including a chemical mechanical polishing (CMP) or an etch-back process, is performed so as to remove upper part of the insulating material layer, such that the STI 15 is formed. The substrate not etched, and surrounded or separated by the STI in plan view is an active region 10, over which transistors or other semiconductor devices are formed.

Figure 2B:
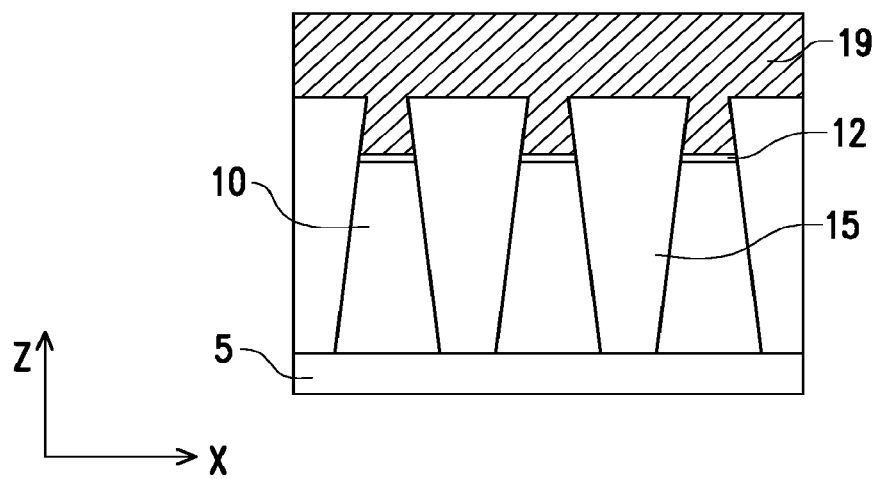
Figure 2C:
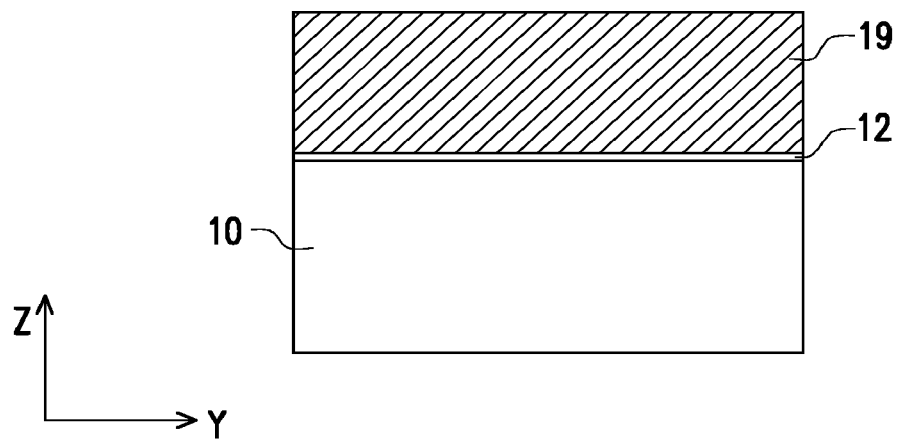

After the STI 15 is formed, the silicon nitride layer 14 is removed and a first conductive material layer 19 is formed, as shown in FIGS. 2A-2C. The silicon nitride layer 14 can be removed by using $H_3PO_4$. The conductive material, such as undoped or doped polysilicon, can be formed by CVD. A thickness of the first conductive material layer 19 is in a range from about 80 nm to 160 nm in some embodiments.

Figure 3A:
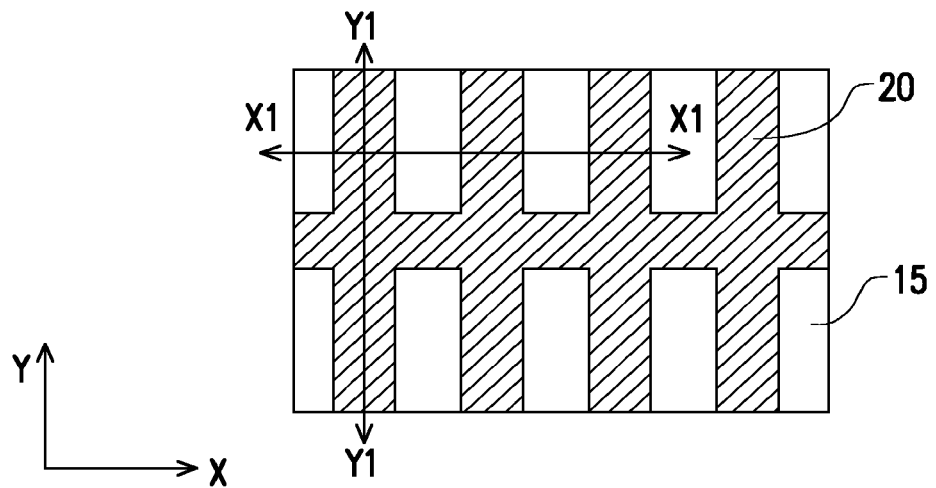
Figure 3B:
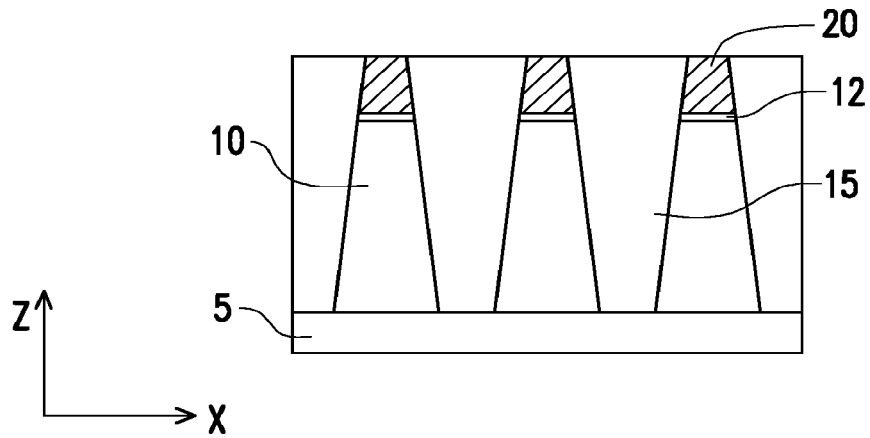
Figure 3C:
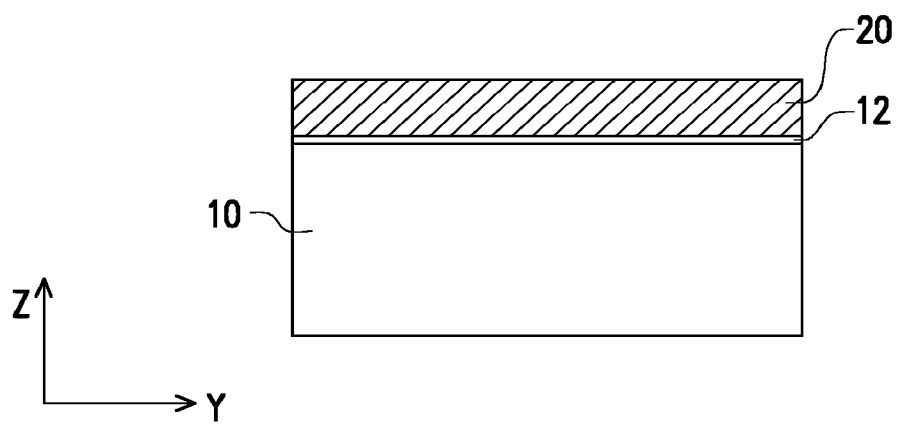

Subsequently, the first conductive material layer 19 is planarized by CMP, as shown in FIG. 3A-3C, thereby forming floating gate patterns (FG patterns) 20 of a non-volatile memory. A width of the FG pattern 20 is in a range from about 80 nm to about 120 nm and a thickness of the FG 20 is in a range from about 20 nm to about 70 nm, in some embodiments.

Figure 4A:
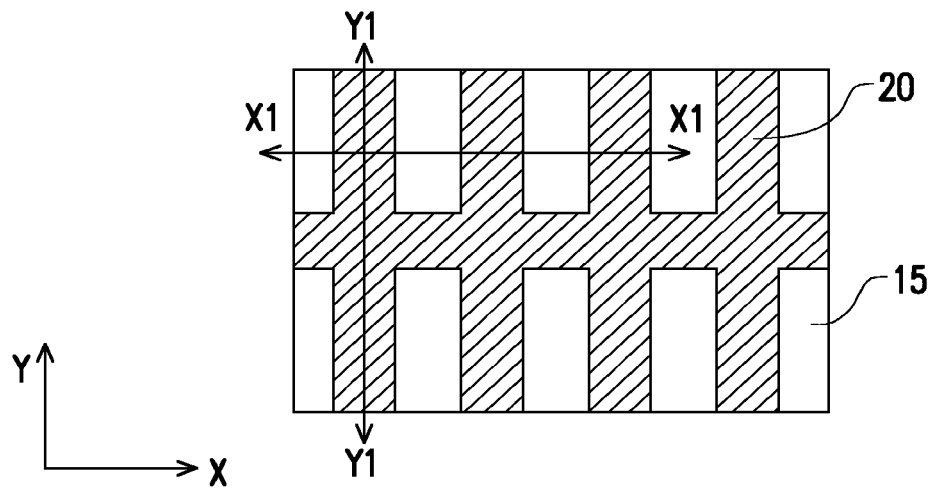
Figure 4B:
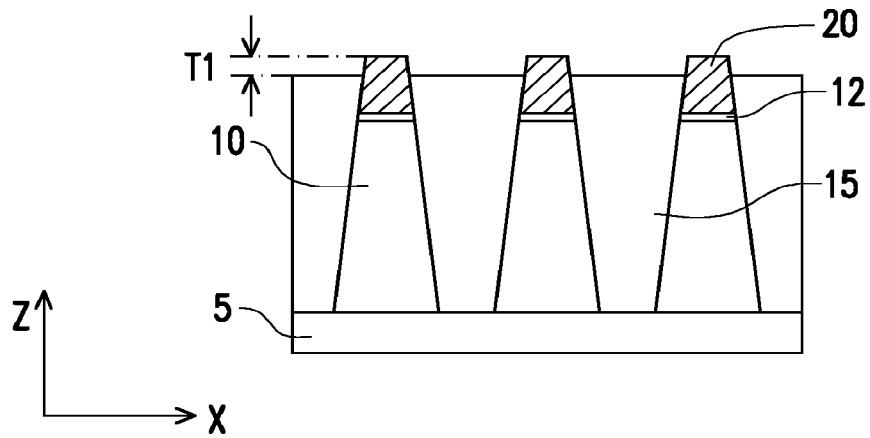
Figure 4C:
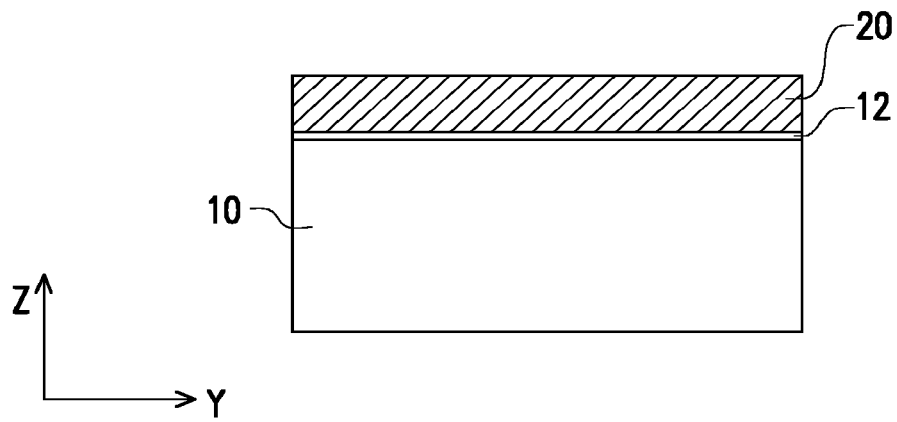

After the FG pattern 20 is formed, the STI 15 is recessed by using an etch-back process, as shown in FIGS. 4A-4C. An amount T1 of the recess is in a range from about 30 nm to about 100 nm in some embodiments.

Figure 5A:
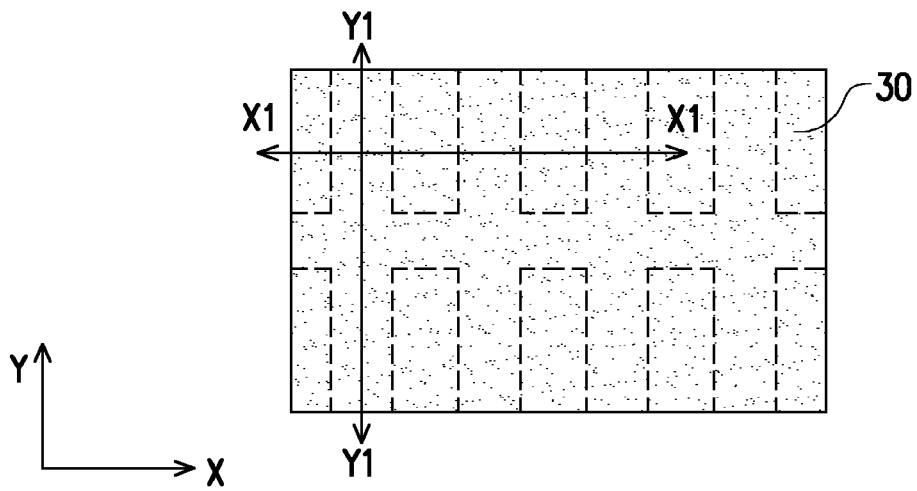
Figure 5B:
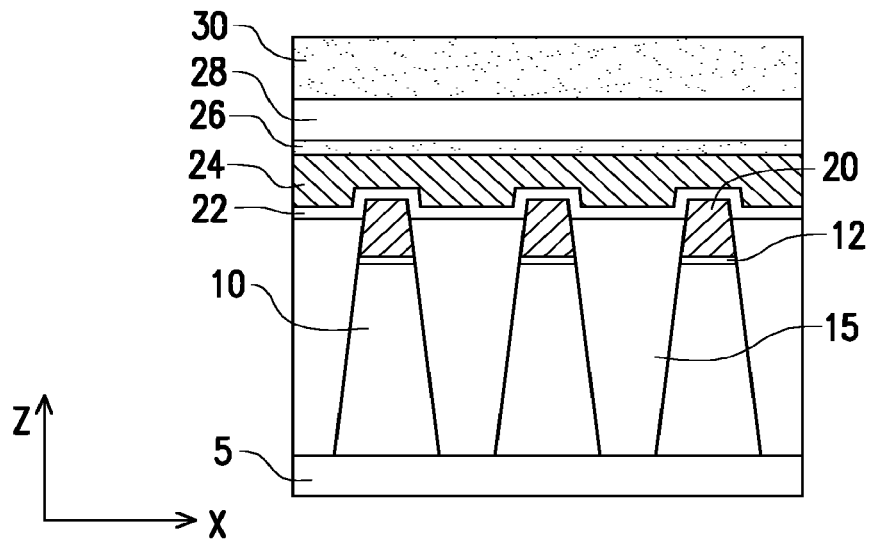
Figure 5C:
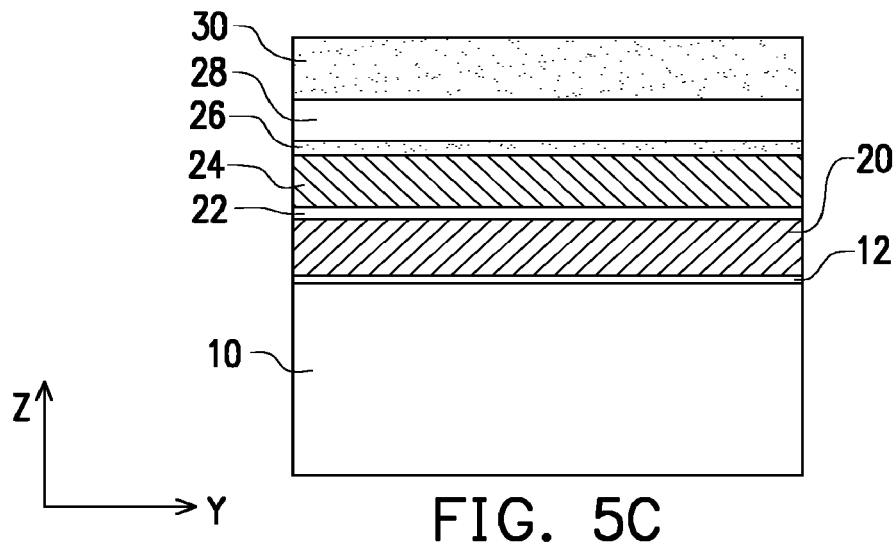

After the STI 15 is recessed, a stacked layer of first insulating layer stack 22, a second conductive layer 24, a second insulating layer stack including insulating layers 26, 28 and 30 is formed over the FG pattern 20 and the STI 15, as shown in FIGS. 5A-5C. The first insulating layer stack 22 includes a silicon oxide-silicon nitride-silicon oxide (ONO) structure, having thicknesses of about 30-50 nm, about 70-90 nm and about 30-50 nm, respectively, in some embodiments. The second conductive material layer 24 is, for example, doped or undoped polysilicon having a thickness of about 45 nm to about 70 nm, in some embodiments. The insulating layer 26 is, for example, silicon nitride having a thickness of about 7 nm to about 10 nm, the insulating layer 28 is, for example, silicon oxide having a thickness of about 70 nm to 100 nm, and the insulating layer 30 is, for example, silicon nitride having a thickness of about 800 nm to about 1200 nm, in some embodiments. These layers (22-30) can be formed by CVD. The silicon oxide or nitride layers may be replaced with silicon oxynitride, SiOCN or SiCN.

Figure 6A:
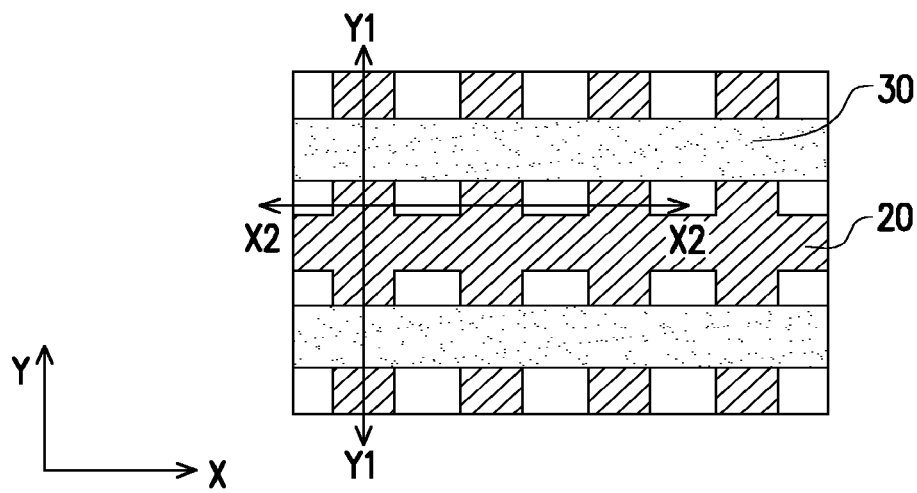
Figure 6B:
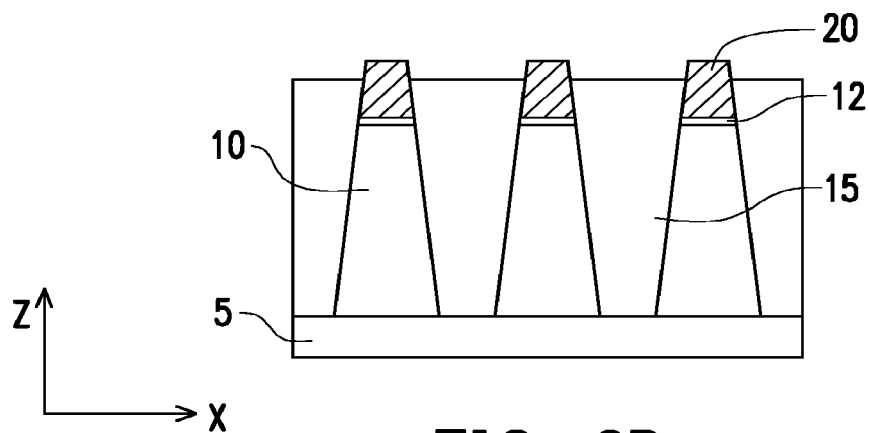
Figure 6C:
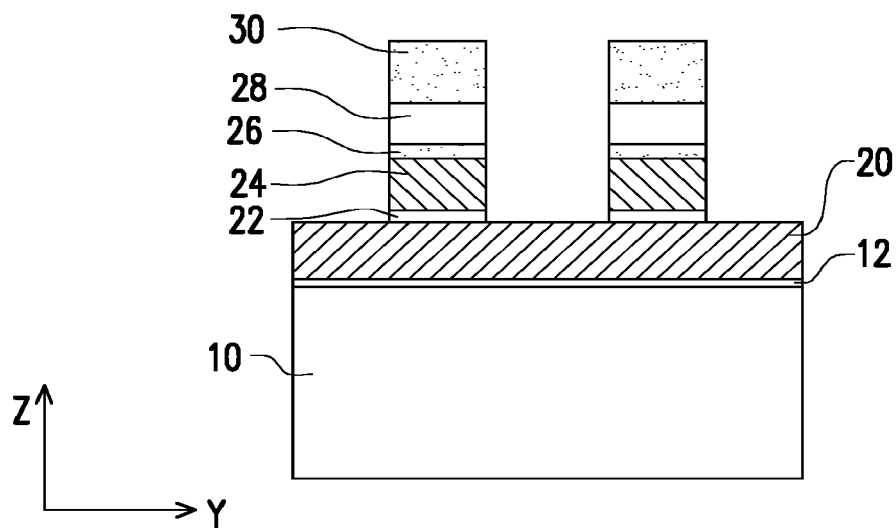

Subsequently, the stacked layer of FIGS. 5A-5C is patterned as shown in FIGS. 6A-6C by using lithography and etching operations, thereby forming a gate stack structure including an ONO layer 22 and a control gate (CG) 24. As shown in FIGS. 6B and 6C, the etching is stopped at the polysilicon layer 20.

Figure 7A:
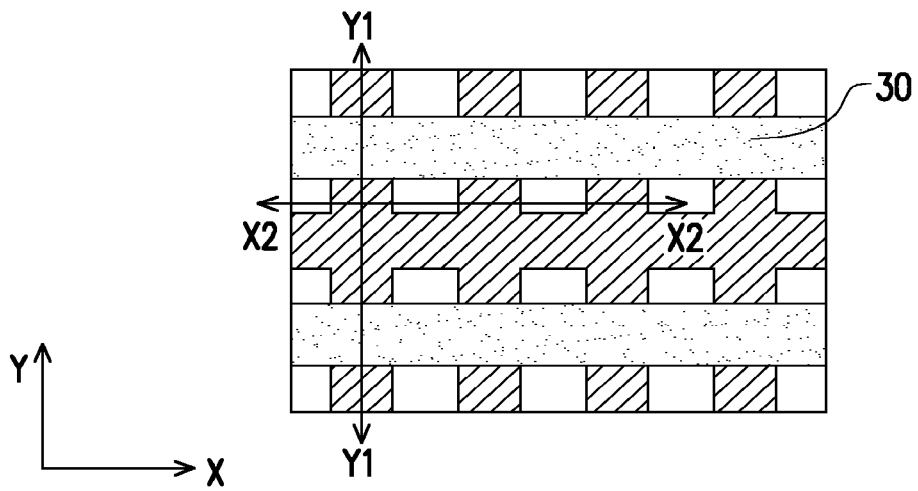
Figure 7B:
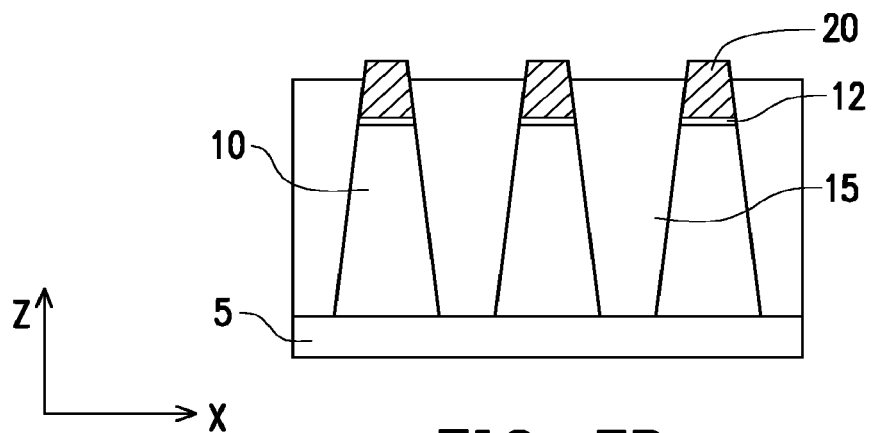
Figure 7C:
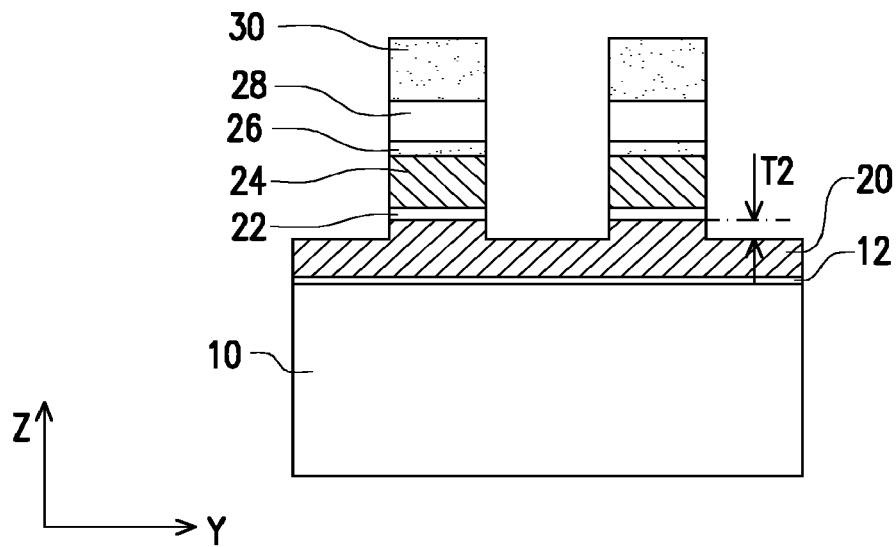

Subsequently, as shown in FIGS. 7A-7C, the polysilicon layer 20 is recessed by using the insulating layers 26, 28 and 30 as an etching mask. An amount T2 of the recess is in a range from about 10 nm to about 40 nm in some embodiments.

Figure 8A:
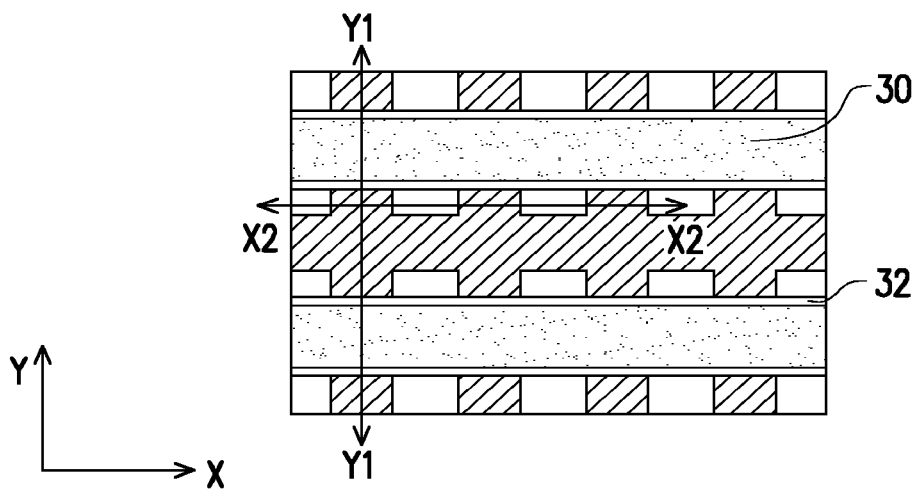
Figure 8B:
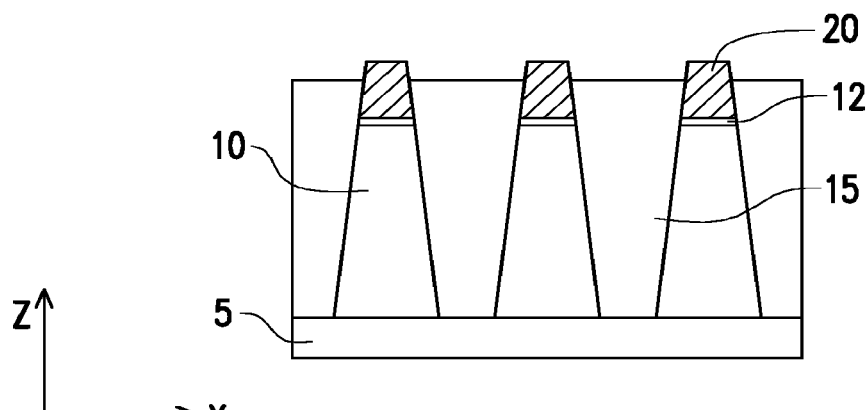
Figure 8C:
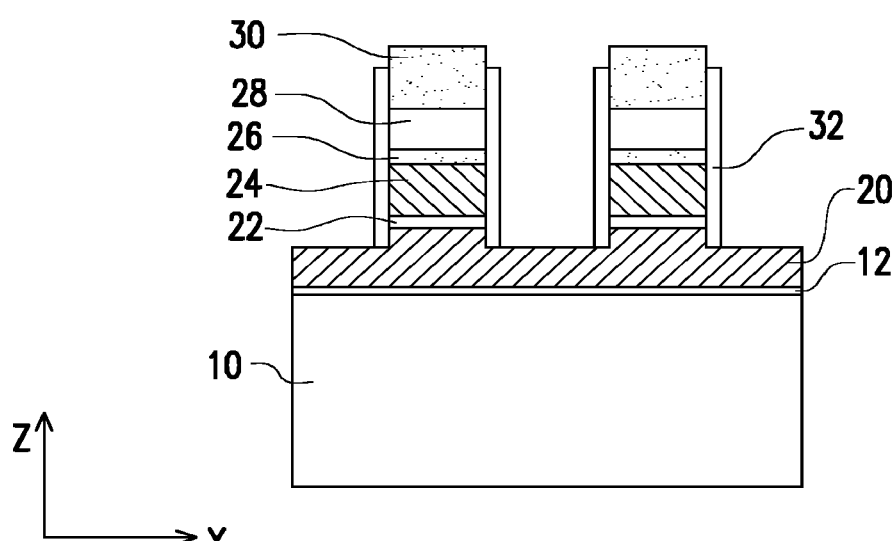

After the recess etching, first sidewall spacers (CG spacers) 32 are formed on both main side faces of the stacked gate structure, as shown in FIGS. 8A-8C. The first sidewall spacers 32 are made of, for example, one or more layers of SiN, $SiO_2$ and SiON, and have a thickness in a range from about 10 nm to about 40 nm in some embodiments.

Figure 9A:
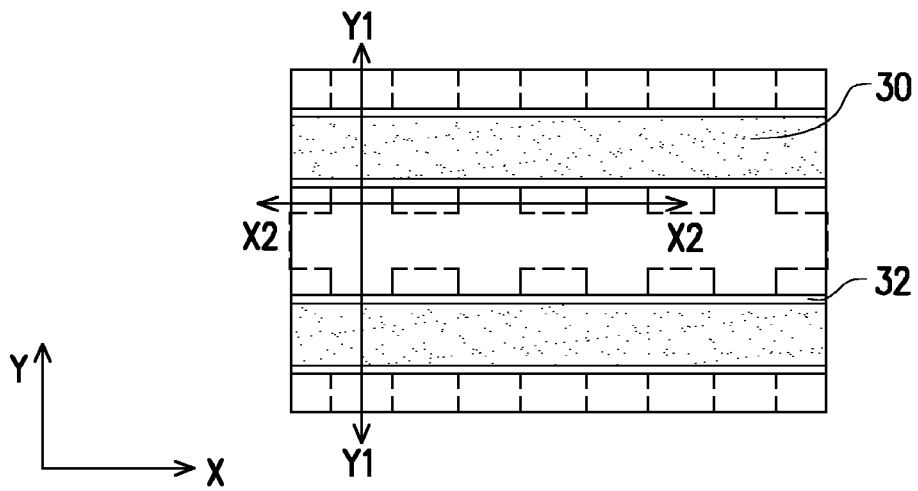
Figure 9B:
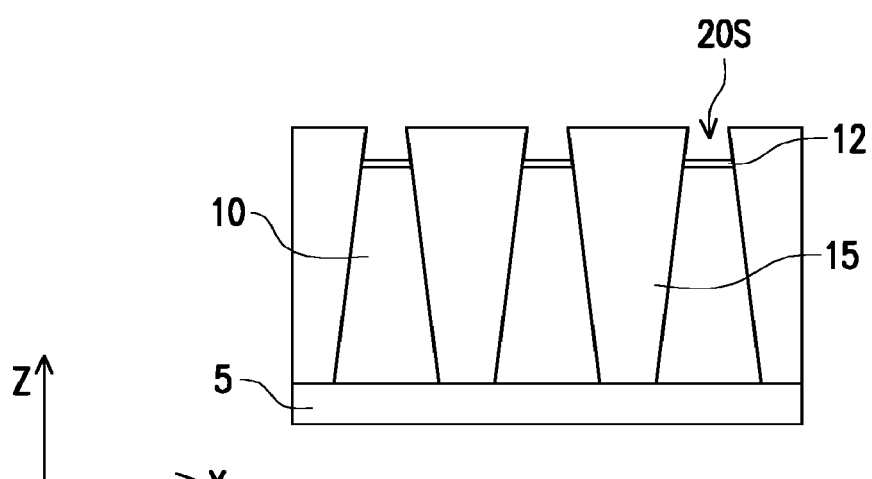
Figure 9C:
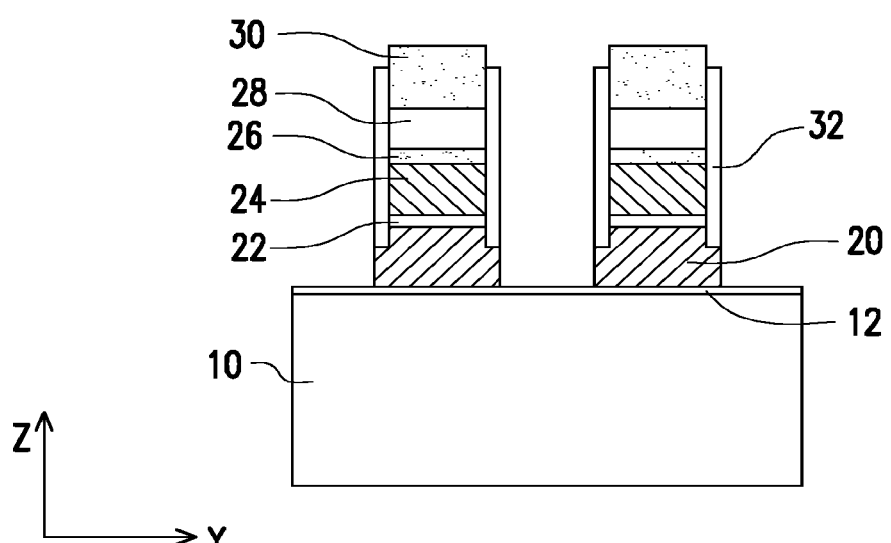

Then, as shown in FIGS. 9A-9C, the polysilicon layer 20 is further etched by using the insulating layers 26, 28 and 30 and the first sidewall spacers as an etching mask, thereby forming the gate stack structure including a floating gate (FG) 20, an ONO layer 22 and a control gate (CG) 24. As shown in FIG. 9B, after the polysilicon layer 20 is etched, spaces 20S are formed over the active regions 10, not covered by the stacked gate structure.

Figure 10A:
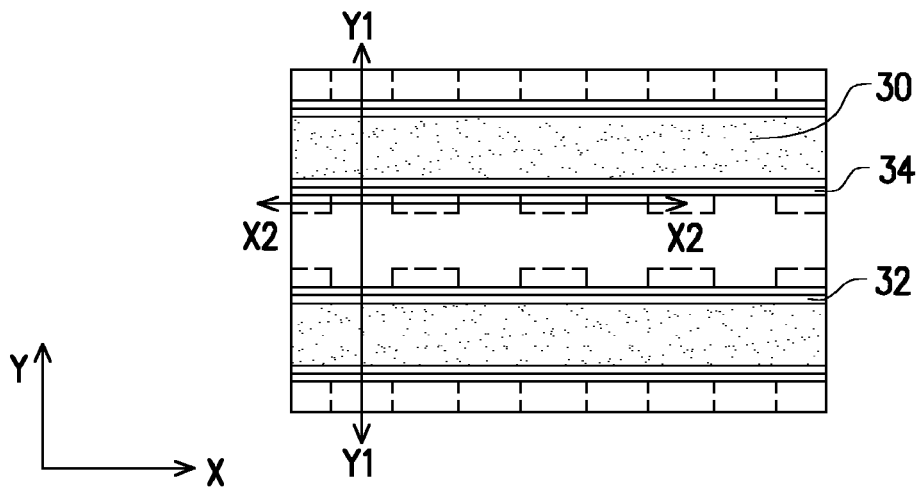
Figure 10B:
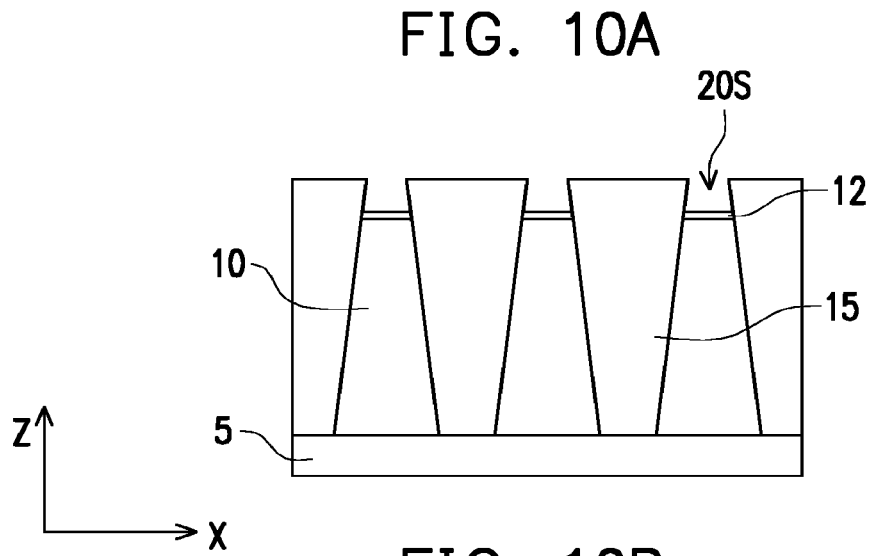
Figure 10C:
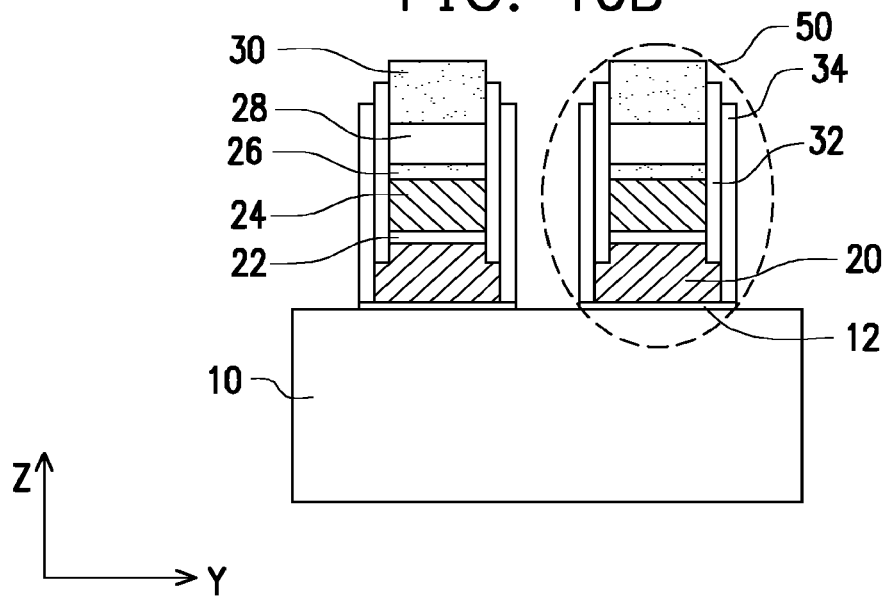

Further, as shown in FIGS. 10A-10C, second sidewall spacers (FG spacers) 34 are formed on both main side faces of the stacked gate structure. The second sidewall spacers 34 are made of, for example, one or more layers of SiN, $SiO_2$ and SiON, which may be the same or different from the first sidewall spacers 32, and have a thickness in a range from about 10 nm to about 40 nm in some embodiments.

As shown in FIG. 10C, the gate stack structure 50 includes a silicon oxide layer 12, a floating gate (FG) 20, an ONO layer 22, a control gate (CG) 24 and an insulating layer stack including insulating layers 26, 28 and 30, which are stacked in this order from the substrate 5.

Figure 11A:
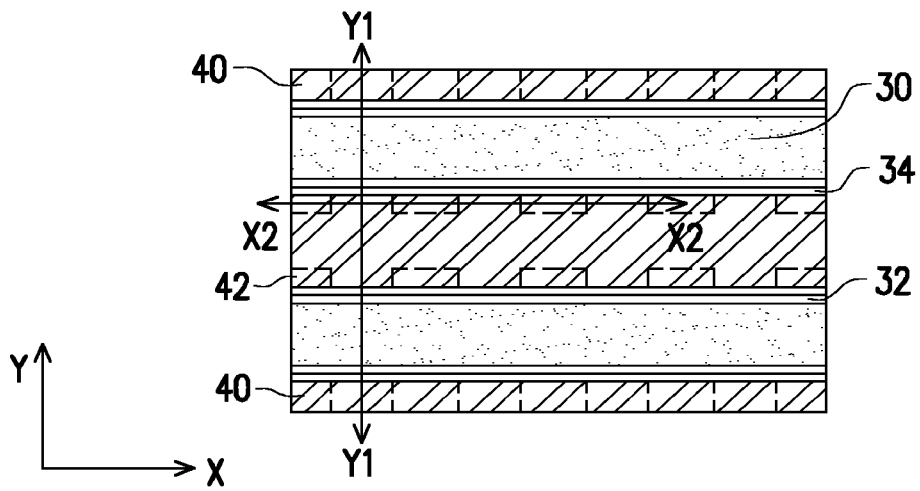
Figure 11B:
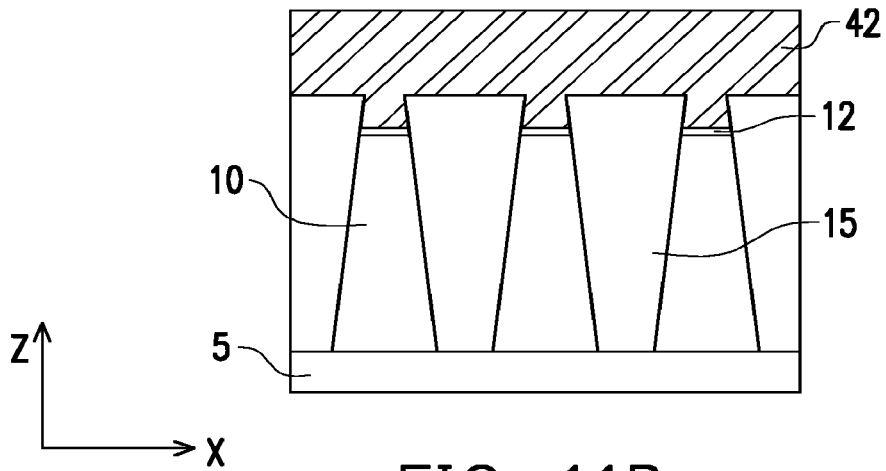
Figure 11C:
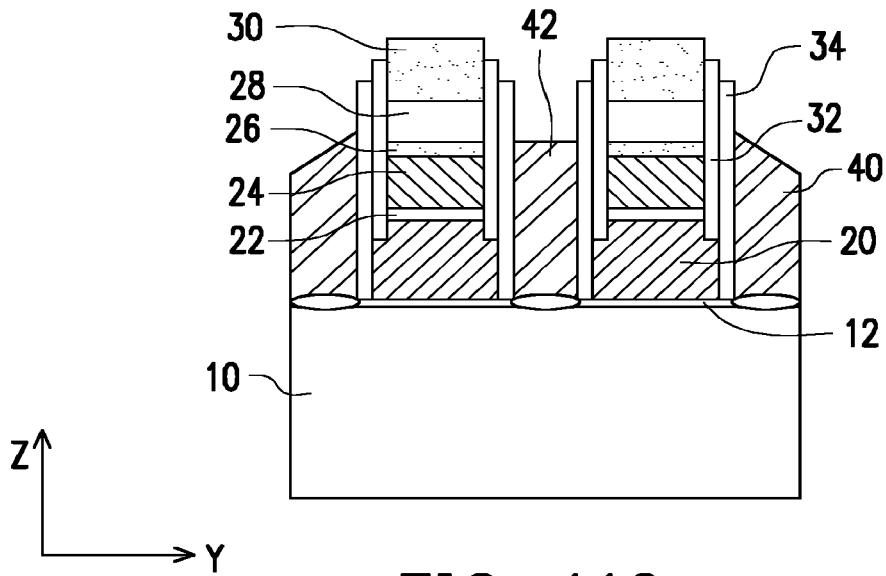

Subsequently, word lines 40 and an erase gate line 42 are formed as shown in FIGS. 11A-11C. The word lines 40 and erase gate line 42 are made of a conductive material, such as doped polysilicon. A thickness of the word lines 40 and erase gate line 42 is in a range from about 80 nm to about 140 nm in some embodiments.

FIGS. 12A-21B show exemplary views illustrating sequential processes for manufacturing a word line and an erase gate line of the non-volatile memory and a gate electrode of a logic circuit according to one embodiment of the present disclosure. In one embodiment of the present disclosure, a semiconductor device includes a non-volatile memory area and a logic circuit area. The semiconductor device may also include a static random access memory (SRAM) area.

Figure 12A:
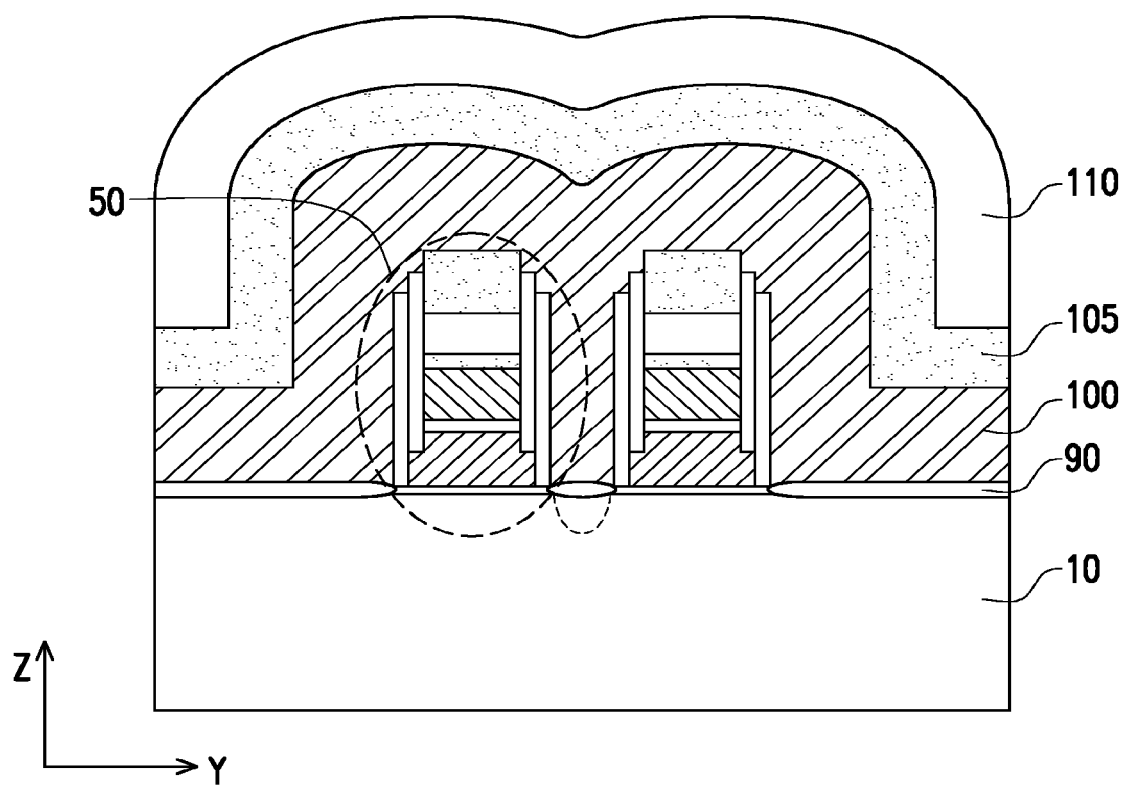
FIGS. 12A-21B show exemplary views illustrating sequential processes for manufacturing a word line of the non-volatile memory and a gate electrode of a logic circuit according to one embodiment of the present disclosure.
Figure 12B:
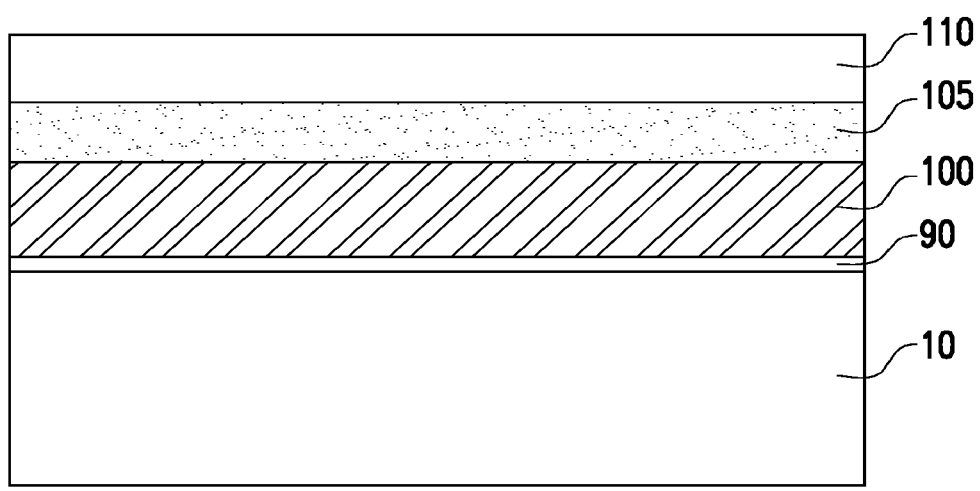
Figure 13A:
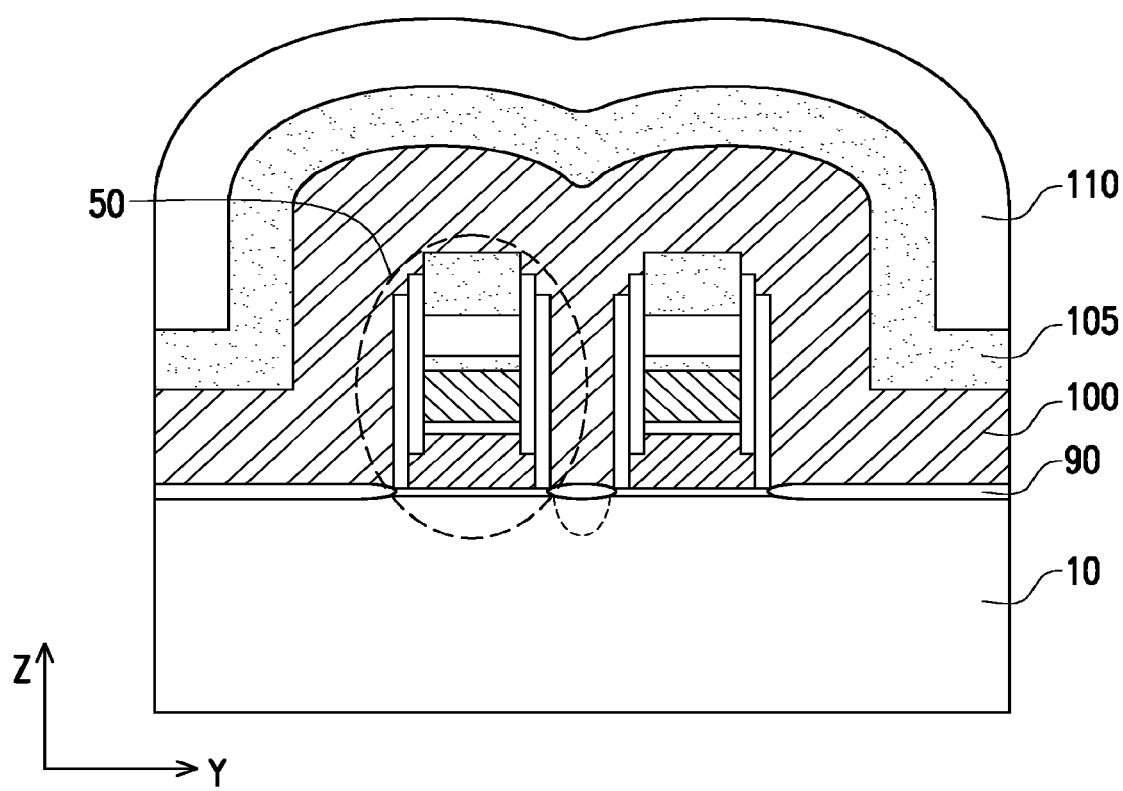
Figure 13B:
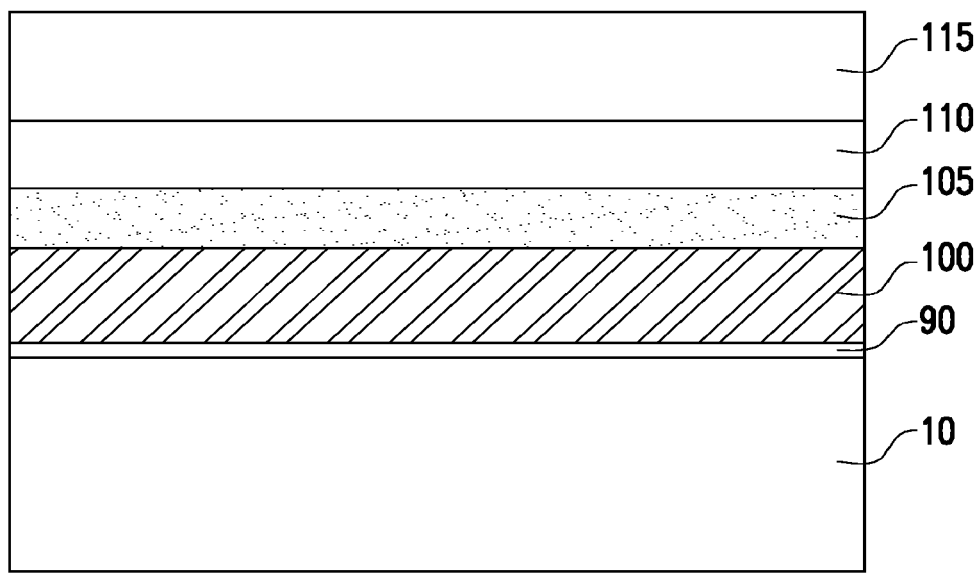

FIGS. 12A, 13A, . . . and 21A show cross sectional views in the non-volatile memory area, and FIGS. 12B, 13B, . . . and 21B show cross sectional views in the logic circuit area. It is understood that additional operations can be provided before, during, and after processes shown by FIGS. 12A-21B, and some of the operations described below can be replaced or eliminated, for additional embodiments of the method. The order of the operations/processes may be interchangeable.

After the gate stack structures 50 are formed as shown in FIG. 10A-10C, a third conductive material layer 100 is formed over the gate stack structures 50 in the non-volatile memory area and over the active region 10 in the logic circuit area, as shown in FIGS. 12A and 12B. A gate insulating layer 90 is interposed between the surface of the active region and the third conductive material layer 100. The third conductive material layer 100 is, for example, doped or undoped polysilicon and has a thickness in a range from about 60 nm to about 120 nm in some embodiments. Further, a silicon nitride layer 105 and a silicon oxide layer 110 are formed on the third conductive material layer 100 by CVD. A thickness of the silicon nitride layer 105 is in a range from about 50 nm to about 100 nm, and a thickness of the silicon oxide layer 110 is in a range from about 30 nm to about 60 nm, in some embodiments.

Next, as shown in FIGS. 13A and 13B, a mask layer 115 is formed to cover the logic circuit area, while the non-volatile memory area is exposed. The mask layer 115 is, for example, a photo resist pattern.

Figure 14A:
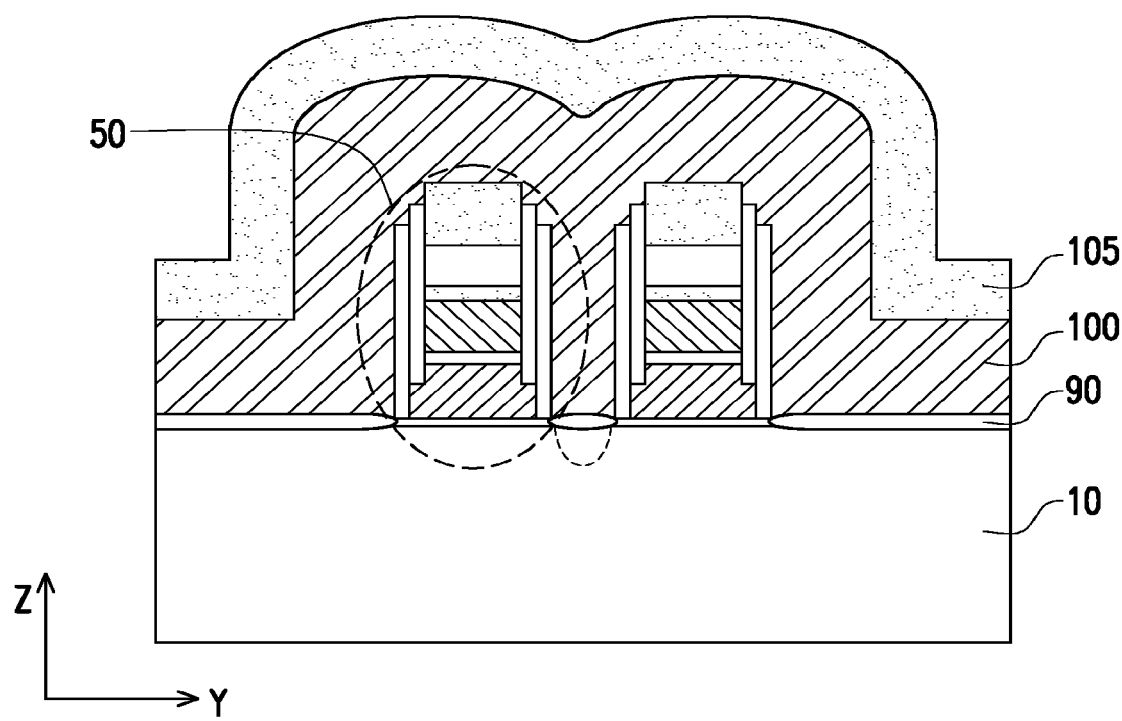
Figure 14B:
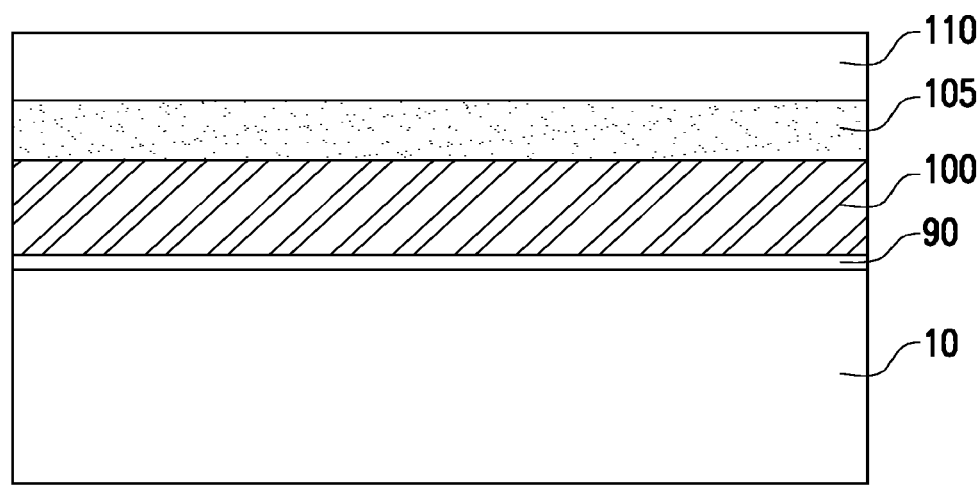

While the logic circuit area is covered by the mask layer 115, the silicon oxide layer 110 is removed in the non-volatile memory area by using wet etching (using HF or BHF) and/or dry etching, as shown in FIGS. 14A and 14B. Subsequently, the mask layer 115 is removed.

Figure 15A:
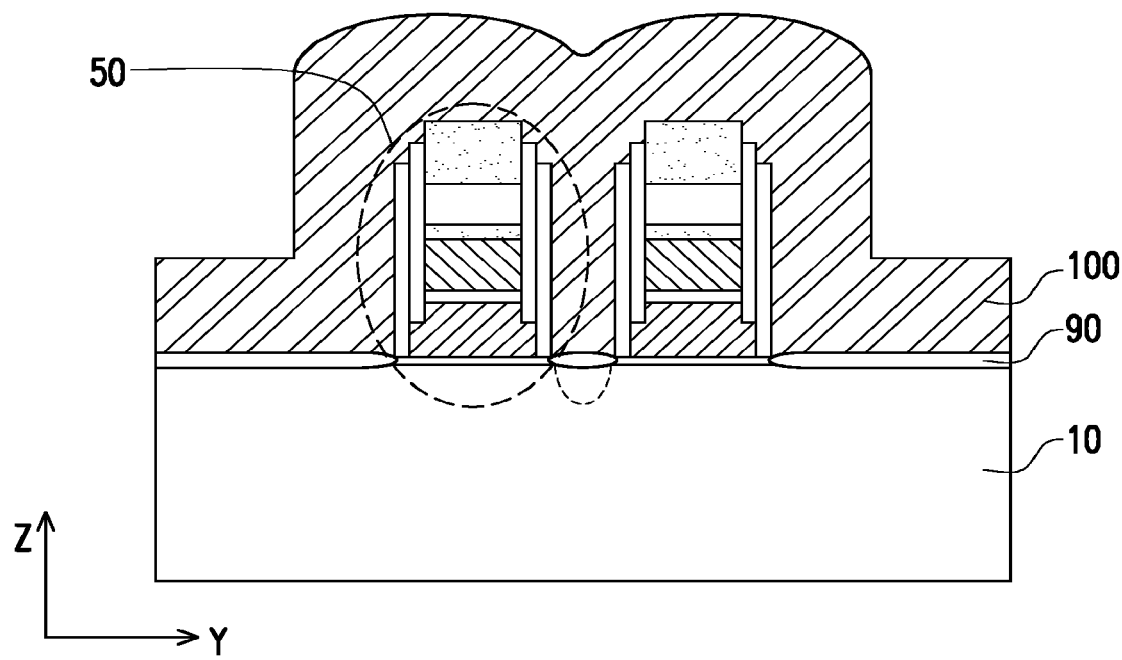
Figure 15B:
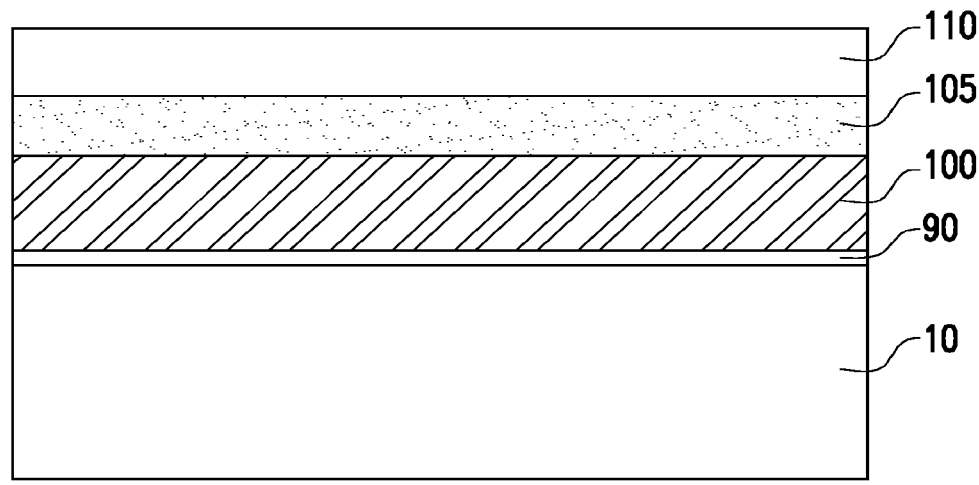

Then, the silicon nitride layer 105 is removed from the non-volatile memory area by using $H_3PO_4$, as shown in FIGS. 15A and 15B.

Figure 16A:
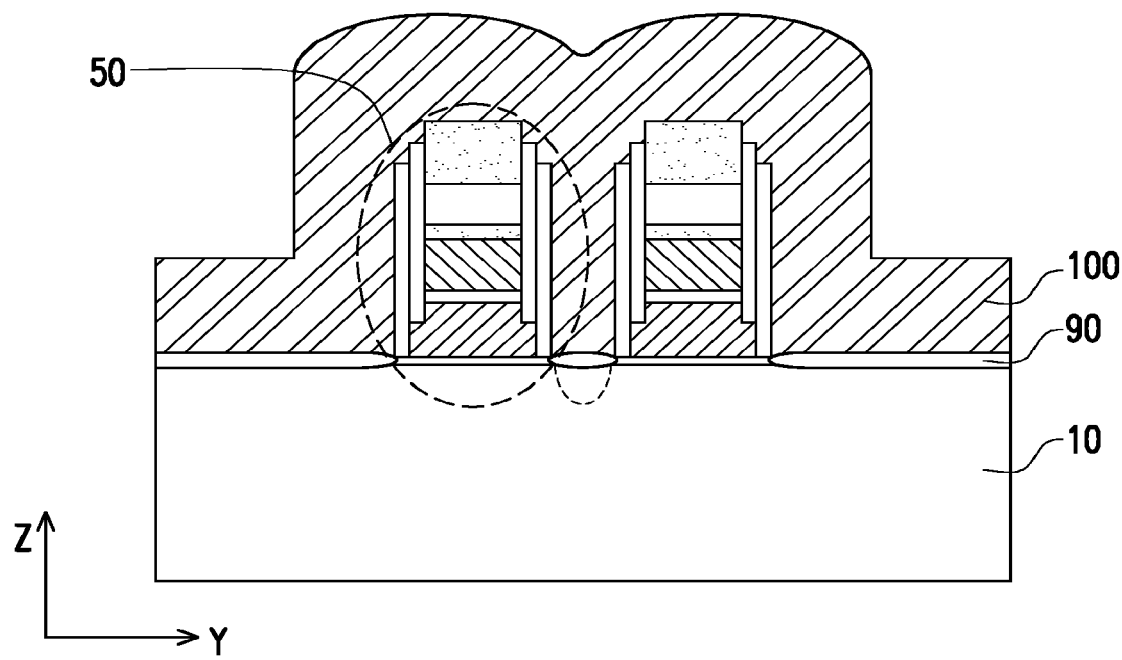
Figure 16B:
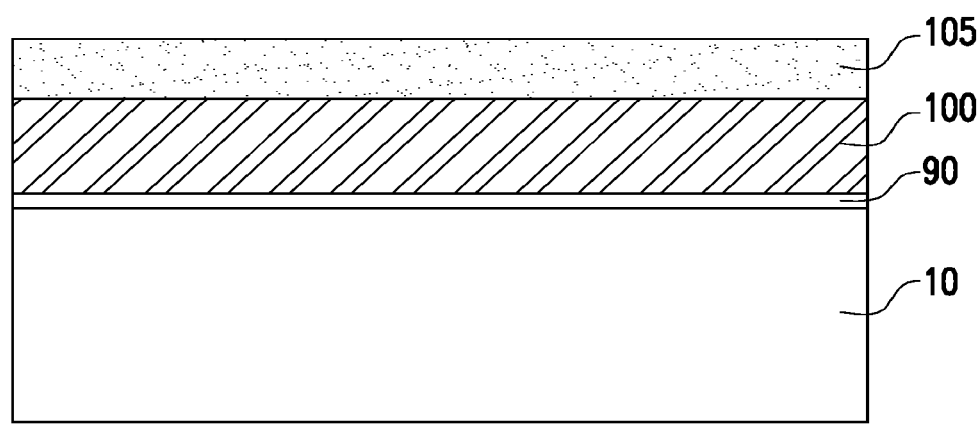

After the silicon nitride layer 105 is removed from the non-volatile memory area, the silicon oxide layer 110 is removed from the logic circuit area, as shown in FIGS. 16A and 16B.

Figure 17A:
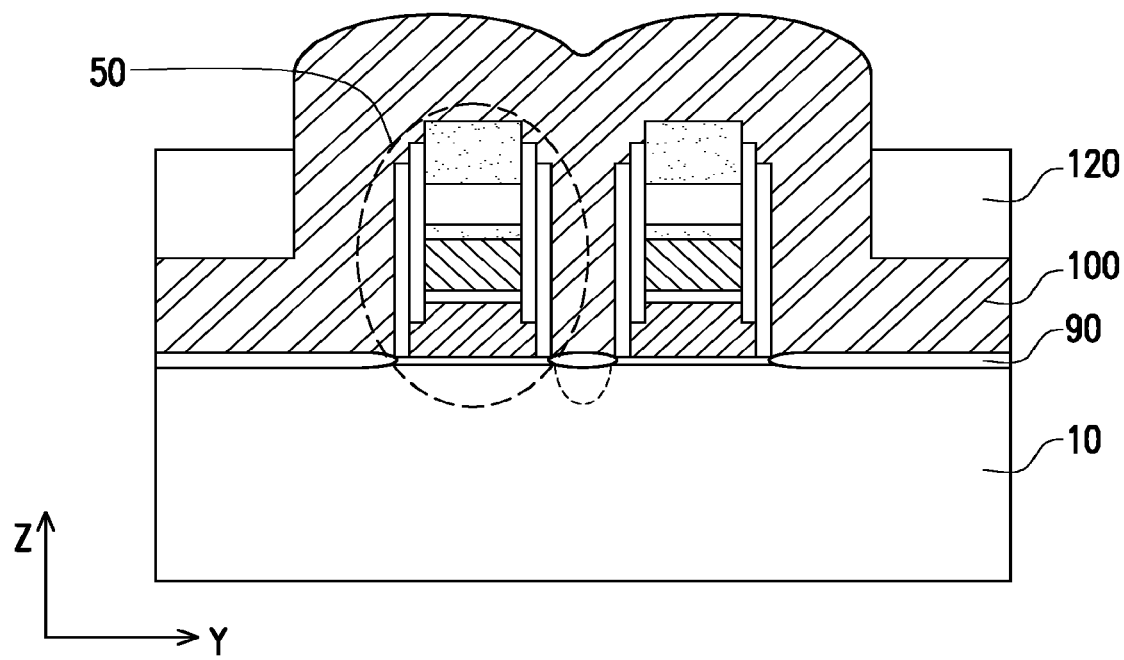
Figure 17B:
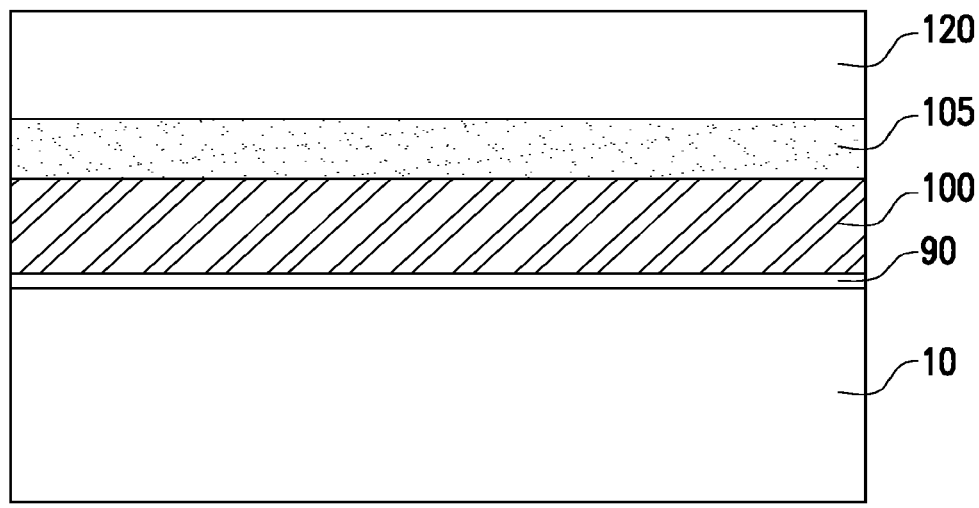

Next, as shown in FIGS. 17A and 17B, a planarization material layer 120 is formed over the non-volatile memory area and the logic circuit area, such that bottom portions of the gates stack structure 50 covered with the third conductive material layer 100 are embedded in the planarization material layer 120. The planarization material layer 120 includes one or more layers of organic materials. In certain embodiments, the planarization material layer 120 includes a bottom antireflective coating (BARC) material generally used in a lithography process.

Figure 18A:
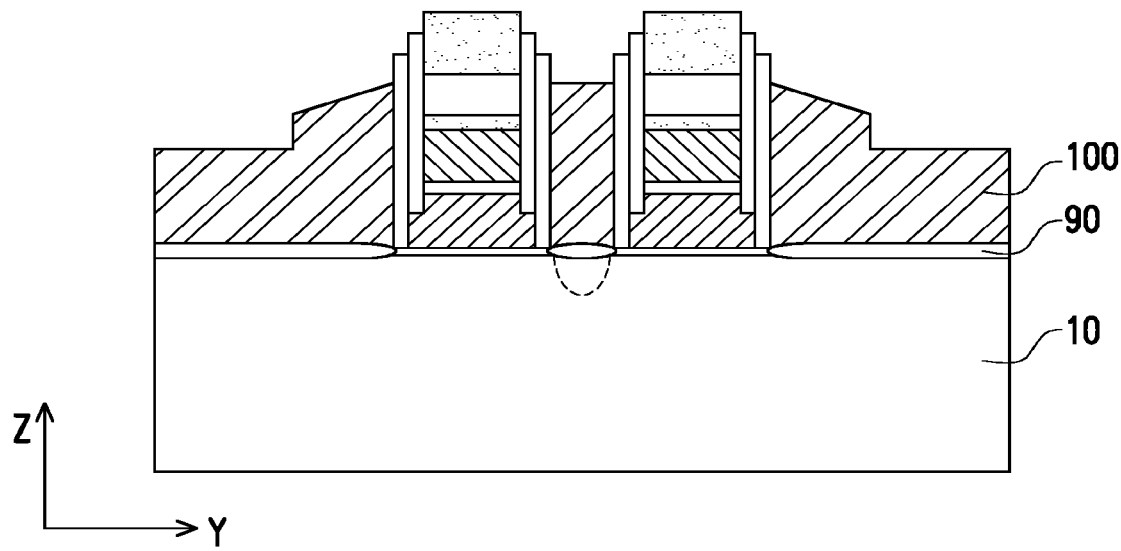
Figure 18B:
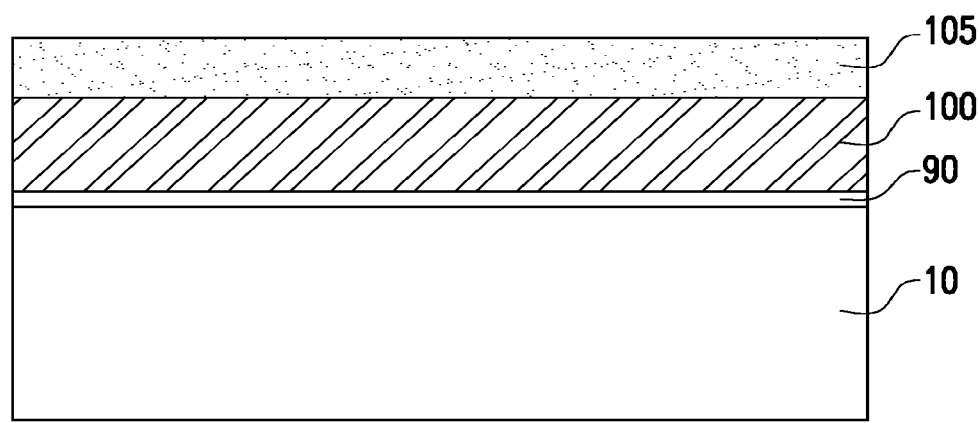

After the planarization material layer 120 is formed, the third conductive material layer 100 is etched-back such that the third conductive material layer 100 is planarized and the upper portion (insulating layer stack) of the gate stack structure 50 is exposed, as shown in FIG. 18A. Subsequently, the planarization material layer 120 is removed, as shown in FIGS. 18A and 18B.

Figure 19A:
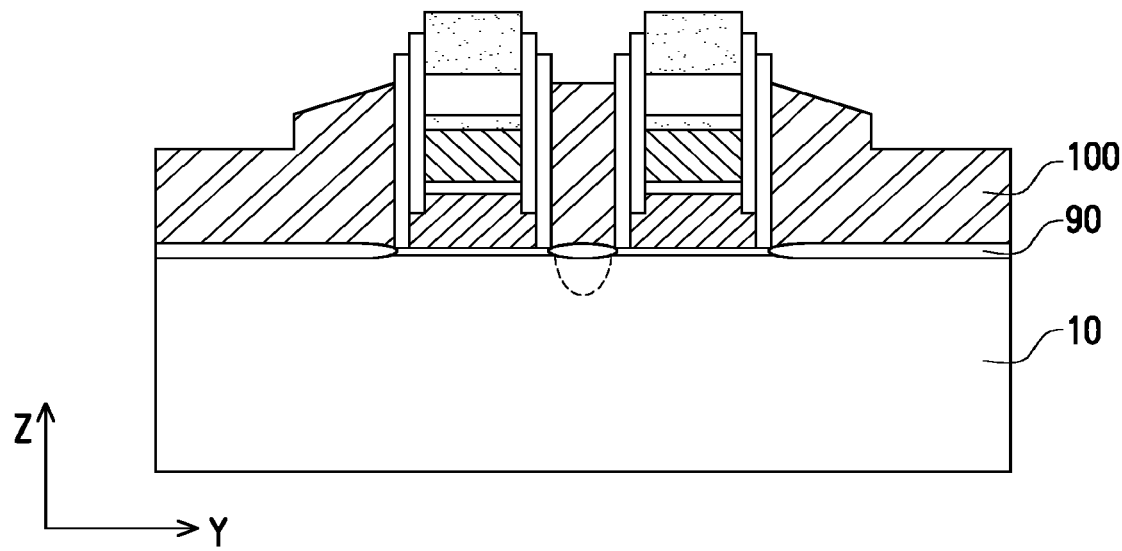
Figure 19B:
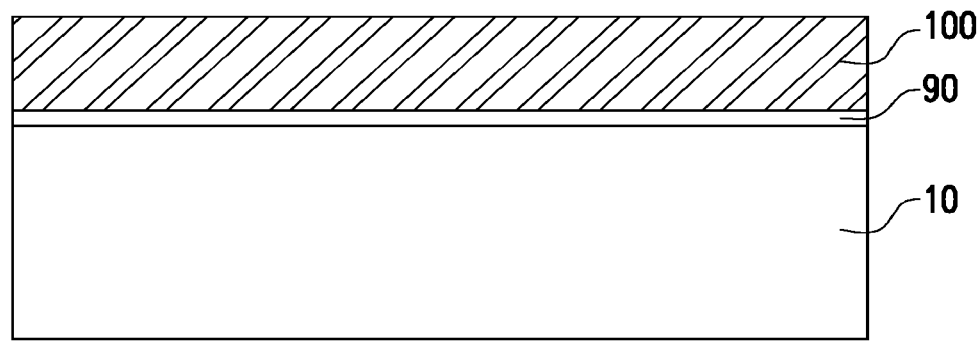

Then, as shown in FIGS. 19A and 19B, the silicon nitride layer 105 is removed from the logic circuit area by using $H_3PO_4$.

Figure 20A:
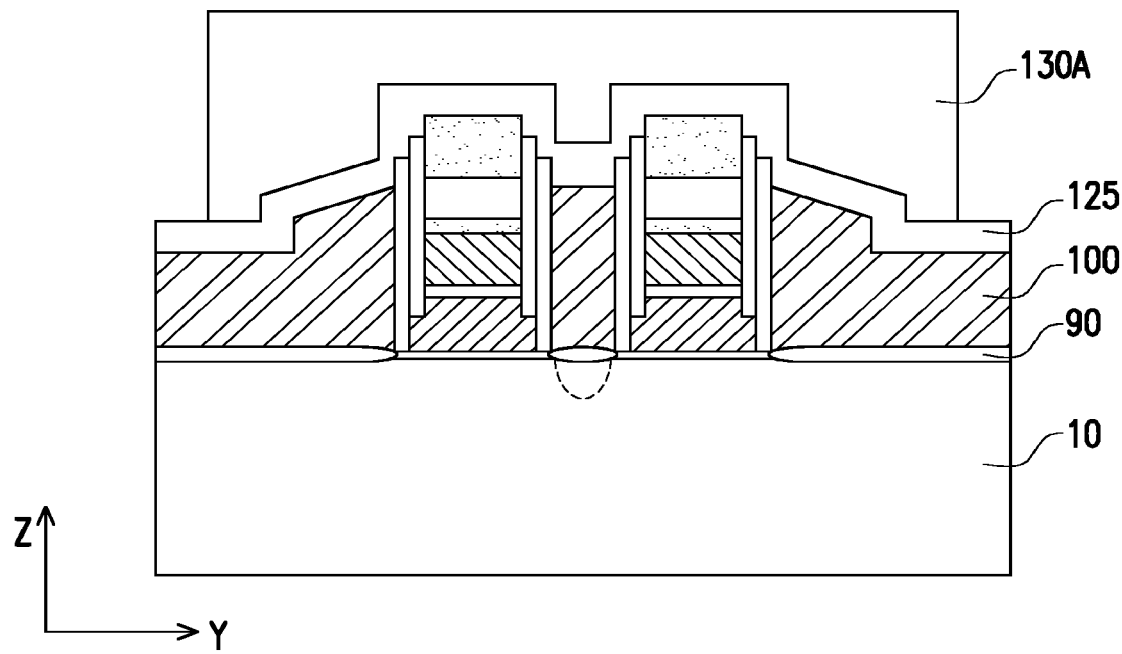
Figure 20B:
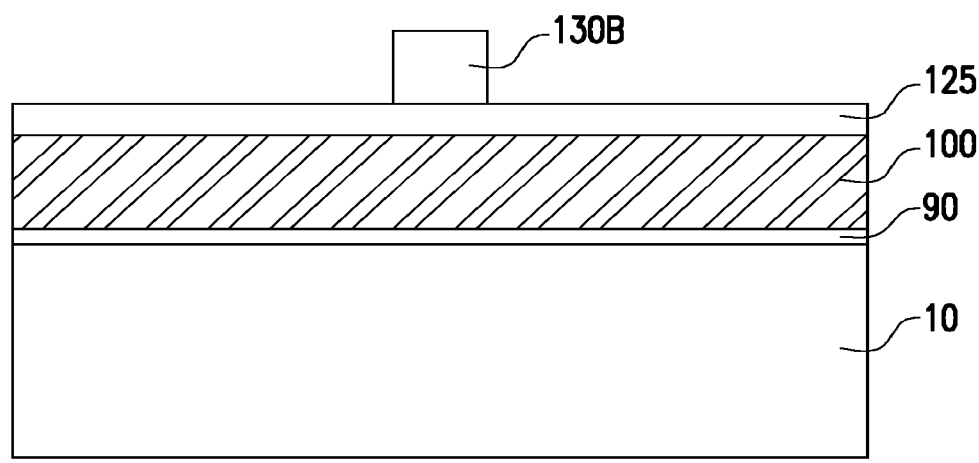

After the silicon nitride layer 105 is removed from the logic circuit area, a hard mask layer 125 is formed and resist patterns 130A and 130B are formed on the hard mask layer 125, as shown in FIGS. 20A and 20B. The resist pattern 130A corresponds to a word line in the non-volatile memory area, and the resist pattern 130B corresponds to a gate electrode in the logic circuit area. The hard mask layer 125 includes one or more layers of silicon oxide, SiN and SiON.

By using the resist patterns 130A and 130B as an etching mask, the hard mask layer 125 is patterned, and by using the patterned hard mask layer 125, the third conductive material layer 100 is patterned. After the hard mask layer is removed, a word line 100A and an erase gate line 100C are obtained in the non-volatile memory area, and a gate electrode 100B is obtained in the logic circuit area, as shown in FIGS. 21A and 21B.

Figure 21A:
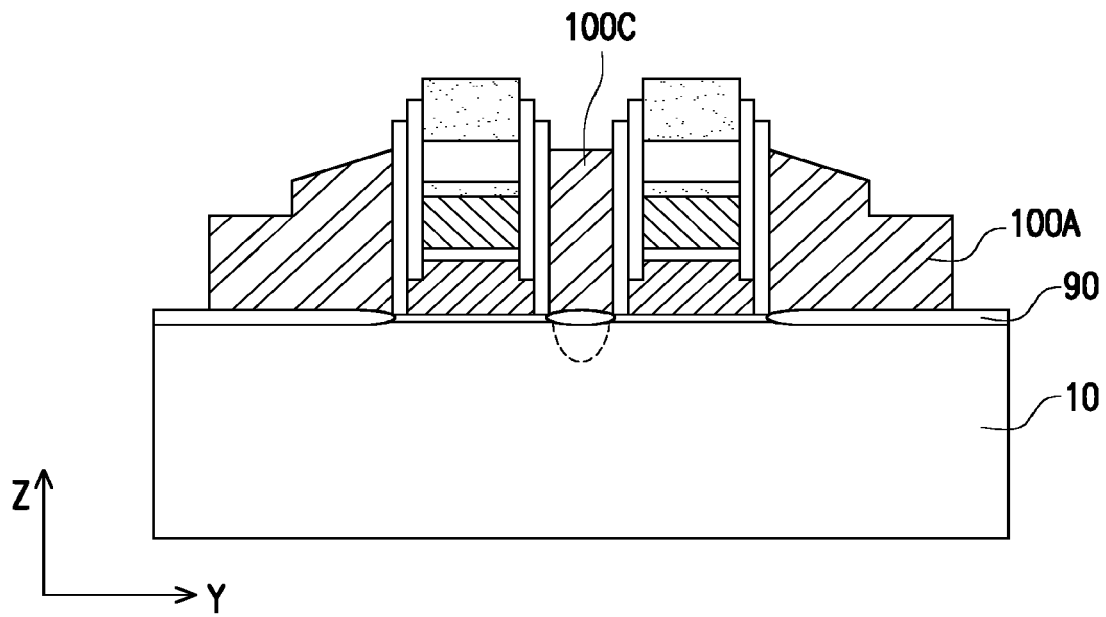
Figure 21B:
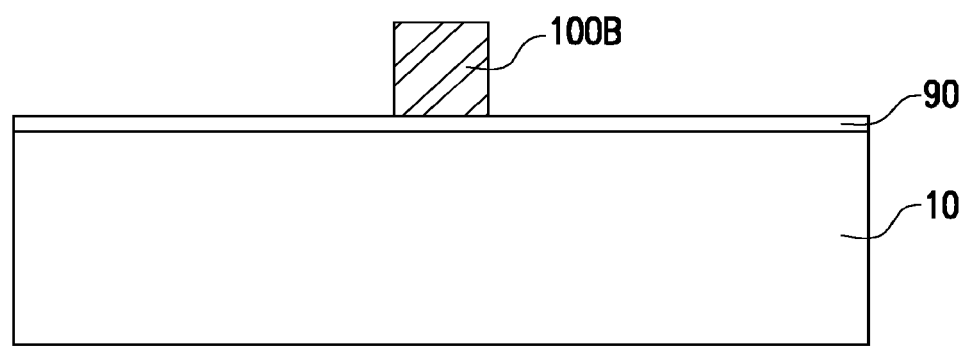

It is understood that the device shown in FIGS. 21A and 21B undergoes further CMOS processes to form various features such as interconnect metal layers, dielectric layers, passivation layers, etc.

FIGS. 22A-28B show exemplary views illustrating sequential processes for manufacturing a word line of the non-volatile memory and a gate electrode of a logic circuit according to another embodiment of the present disclosure. The similar or the same configurations, processes, materials and/or structures as set forth above may be employed in the following embodiment, and the detailed explanation may be omitted.

Figure 22A:
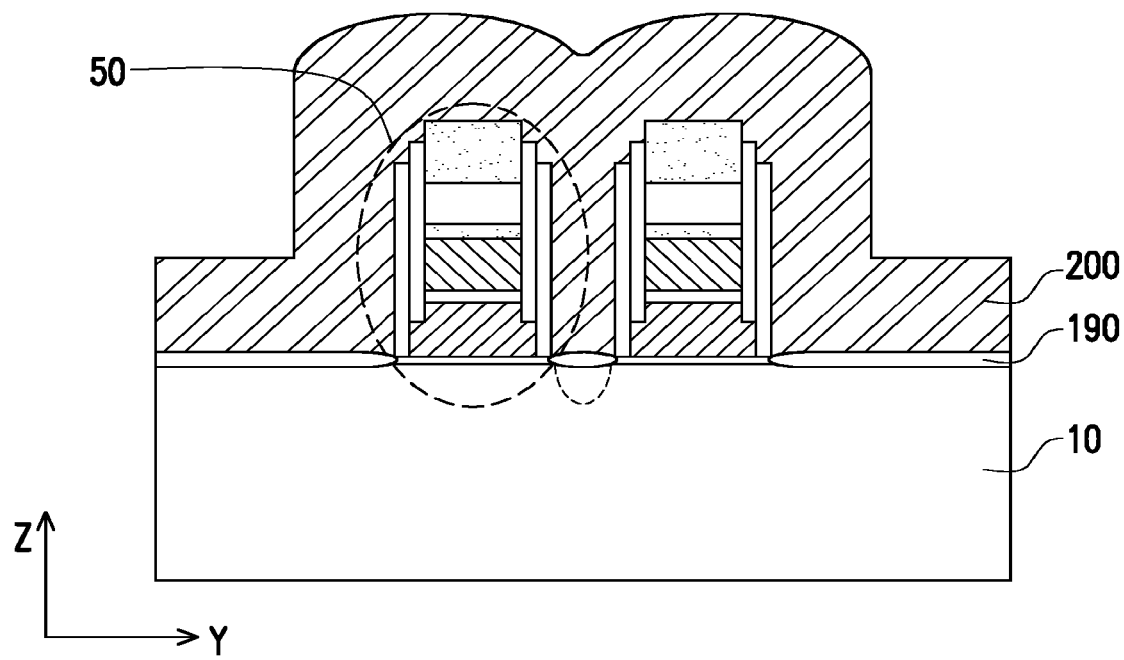
FIGS. 22A-28B show exemplary views illustrating sequential processes for manufacturing a word line of the non-volatile memory and a gate electrode of a logic circuit according to another embodiment of the present disclosure.
Figure 22B:
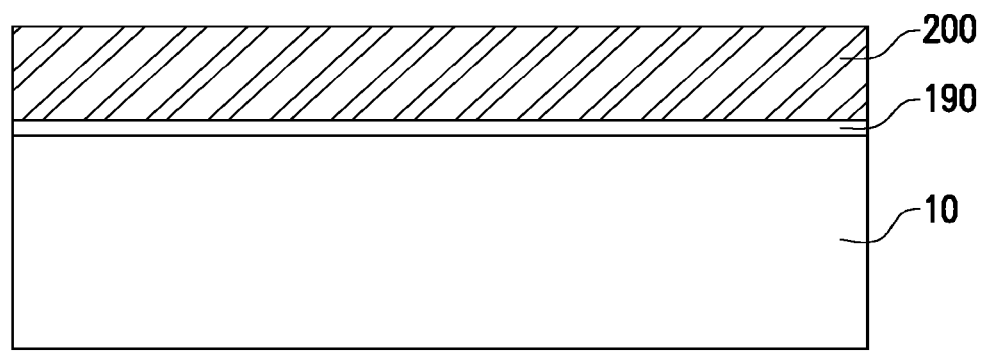
Figure 23A:
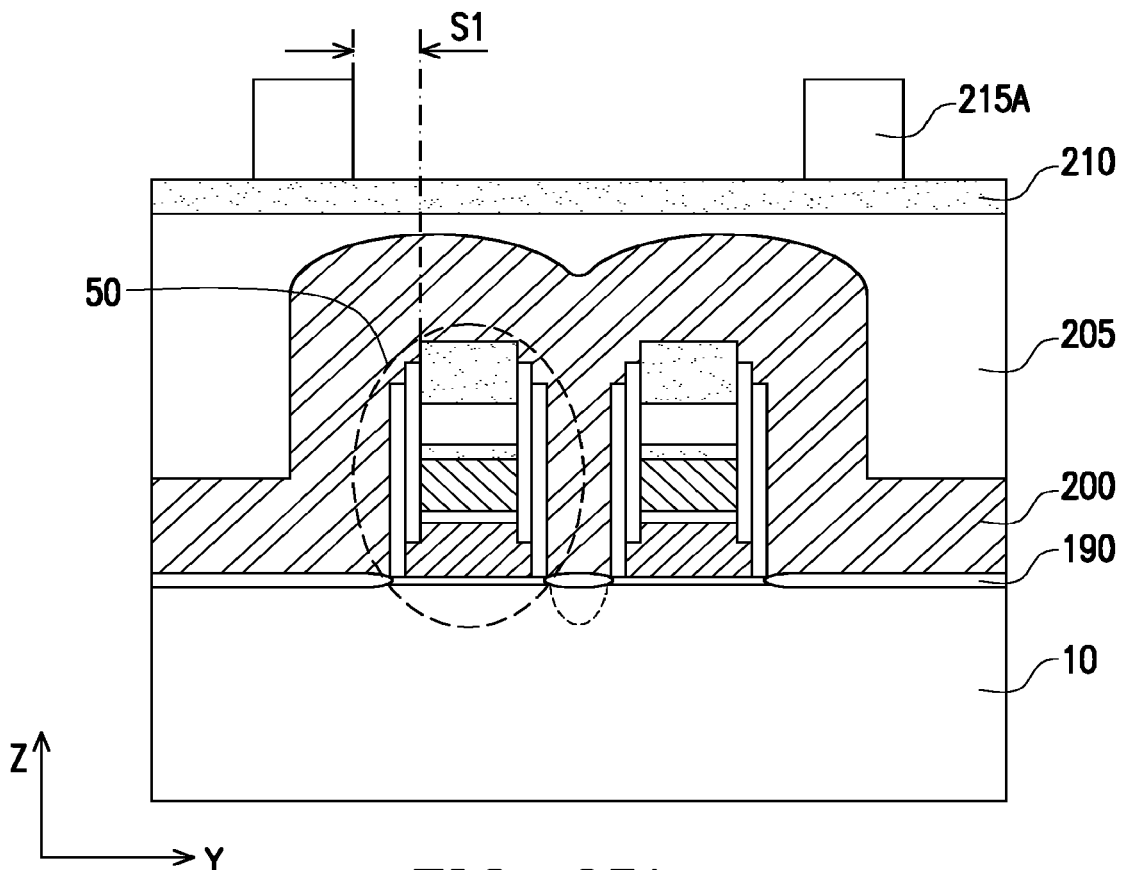
Figure 23B:
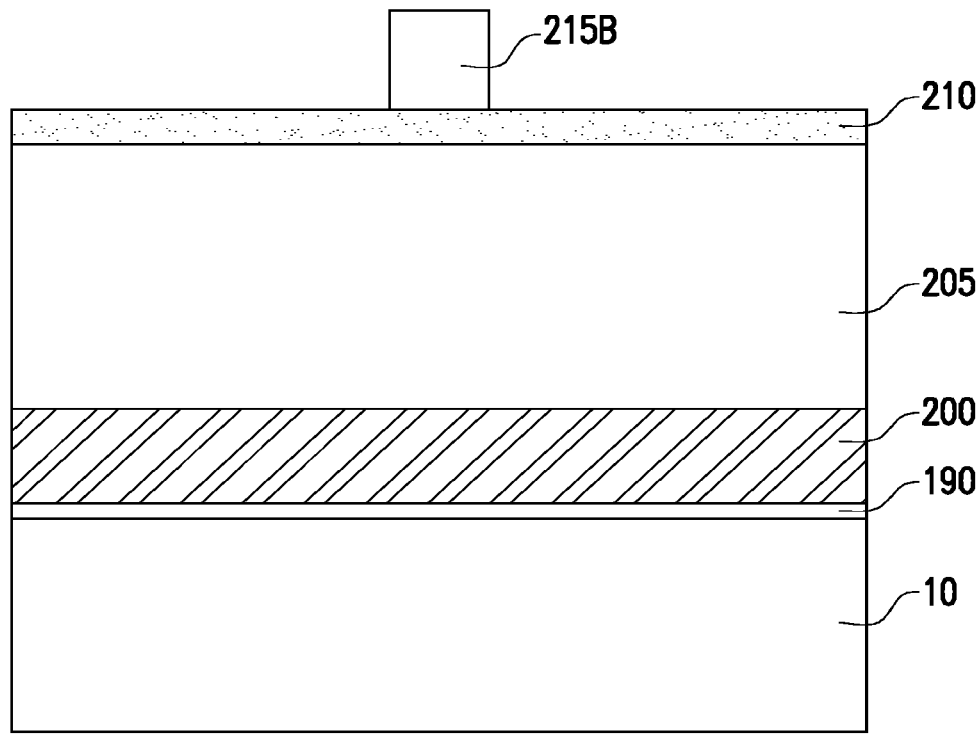
Figure 23C:
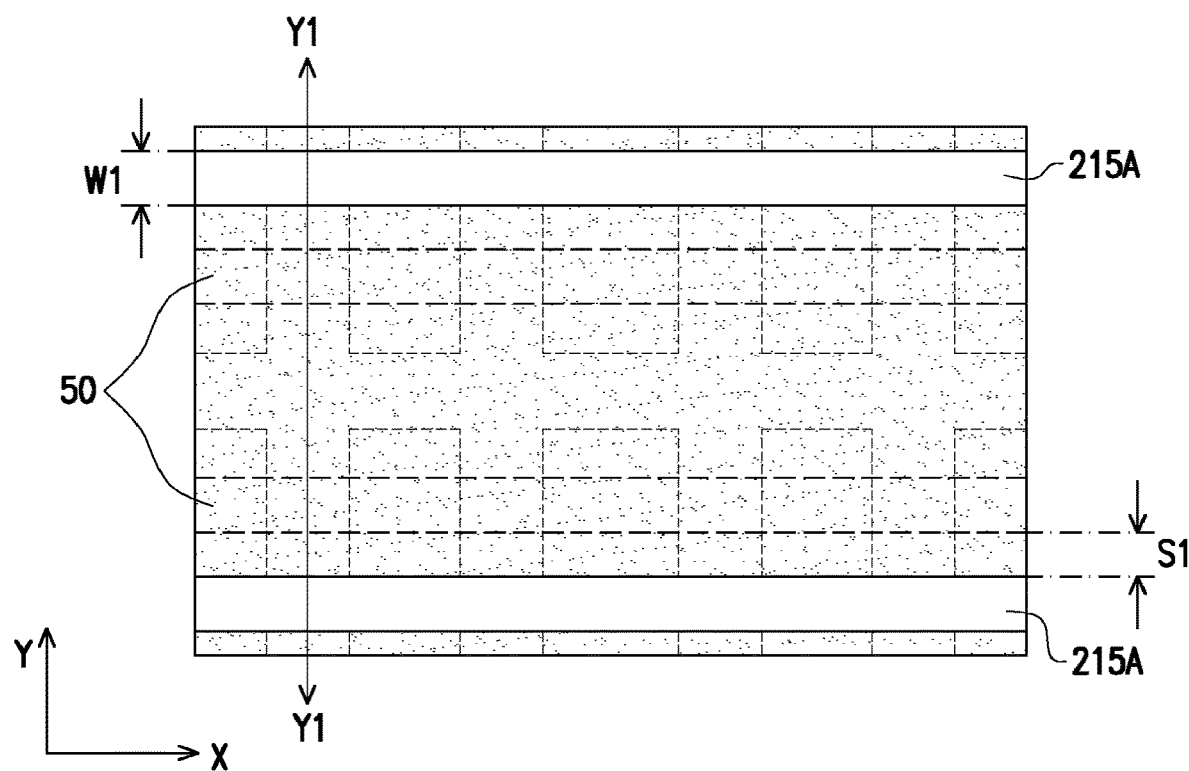

FIGS. 22A, 23A, . . . and 28A show cross sectional views in the non-volatile memory area, and FIGS. 22B, 23B, . . . and 28B show cross sectional views in the logic circuit area. FIG. 23C is a plan view. It is understood that additional operations can be provided before, during, and after processes shown by FIGS. 22A-28B, and some of the operations described below can be replaced or eliminated, for additional embodiments of the method. The order of the operations/processes may be interchangeable.

After the gate stack structures 50 are formed as shown in FIG. 10A-10C, a third conductive material layer 200 is formed over the gate stack structures 50 in the non-volatile memory area and over the active region 10 in the logic circuit area, as shown in FIGS. 22A and 22B. A gate insulating layer 190 is interposed between the surface of the active region and the third conductive material layer 200. The third conductive material layer 200 is, for example, doped or undoped polysilicon and has a thickness in a range from about 60 nm to about 120 nm in some embodiments.

Then, as shown in FIGS. 23A and 23B, a hard mask layer including a first hard mask layer 205 and a second hard mask layer 210 is formed on the third conductive material layer 200. The first mask layer 205 is formed such that the third conductive material layer 200 formed over the gate stack structure 50 is fully embedded in the first mask layer and the first mask layer has a substantially planarized surface. In certain embodiments, the second mask layer is not used.

The first mask layer 205 includes one or more layers of insulating materials including Si, O, N, C and/or H. The insulating materials can be formed by LPCVD, plasma-CVD or flowable CVD, or coating photo resist.

In the flowable CVD, fflowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. In some embodiments, one or multiple anneal processes are conducted. The flowable film is cured and annealed more than once at temperatures in a range from about 1000° C. to about 1200° C. A thickness of the first mask layer 205 is in a range from about 200 nm to about 300 nm in some embodiments.

The second mask layer 210 includes one or more layers of silicon nitride based material, such as SiN, SiON or SiOCN. A thickness of the second mask layer 210 is in a range from about 30 nm to about 70 nm in some embodiments.

After the hard mask layer is formed, resist mask pattern 215A and 215B are formed in the non-volatile memory area and the logic circuit area, respectively, as shown in FIGS. 23A-23C. FIG. 23C shows a plan view of the non-volatile memory area and FIG. 23A corresponds to line Y1-Y1 of FIG. 23C.

As shown in FIG. 23C, in the non-volatile memory area, the gate stack structures 50 and the mask patterns 215A extend in the X direction and are arranged in parallel with each other in the Y direction. The mask patterns 215A do not overlap the gate stack structures 50 in plan view, as shown in FIG. 23C. The mask patterns 215A are formed above regions where word lines are to be formed. No mask pattern is formed above a region between the gate stack structures 50, where an erase gate line is to be formed. It is noted that the layout shown in FIG. 23C is repeated along the Y direction, and the mask pattern 215A will be disposed between two gate stack structures.

A width W1 of the mask pattern 215A along the Y direction is in a range from about 50 nm to about 100 nm in some embodiments. A space 51 between the mask pattern 215A and the gate stack structure 50 is in a range from about 15 nm to about 45 nm in some embodiments.

In the logic circuit area, the mask pattern 215B corresponds to a gate electrode of a field effect transistor (FET).

Figure 24A:
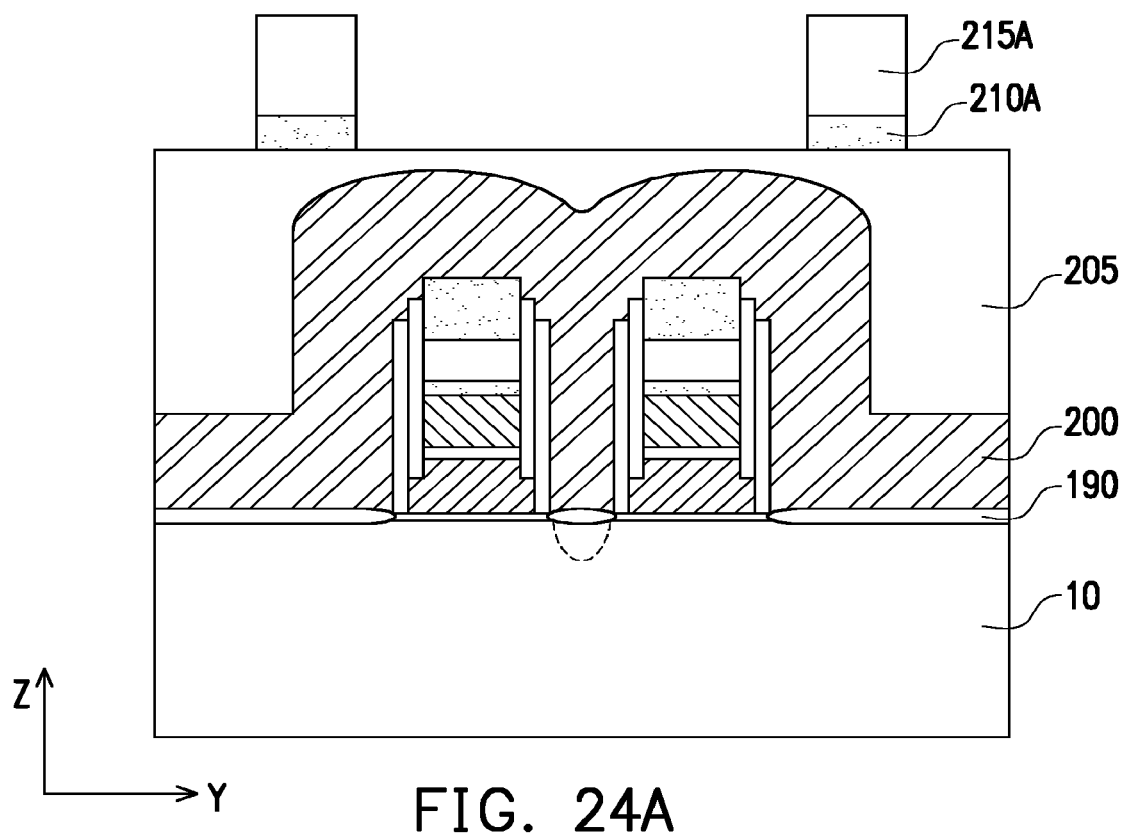
Figure 24B:
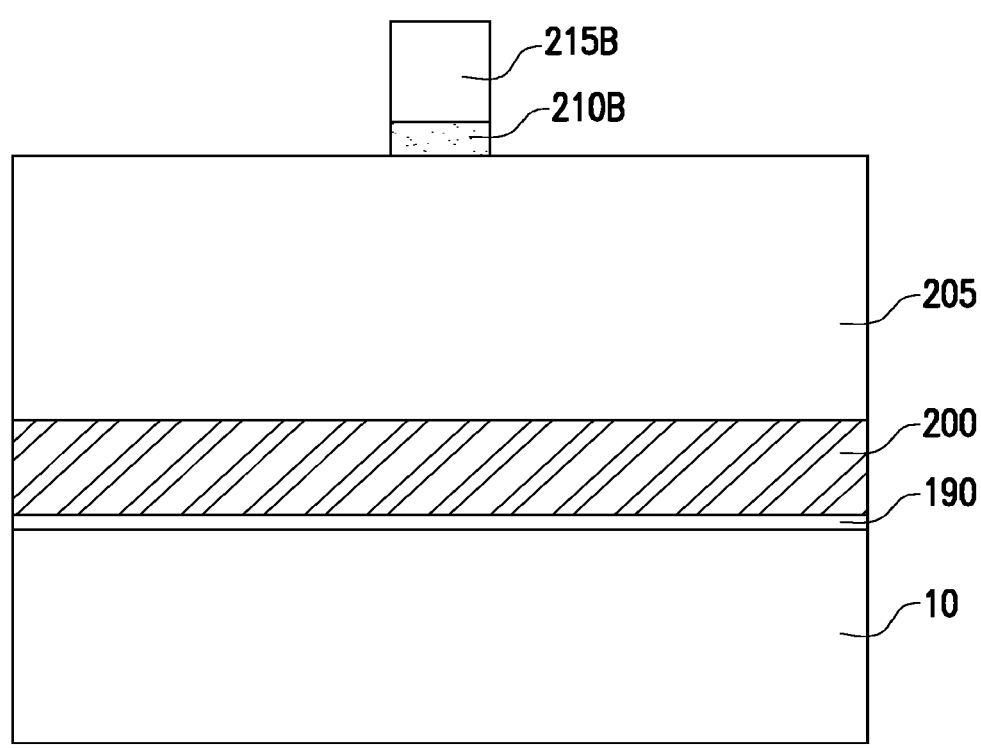
Figure 25A:
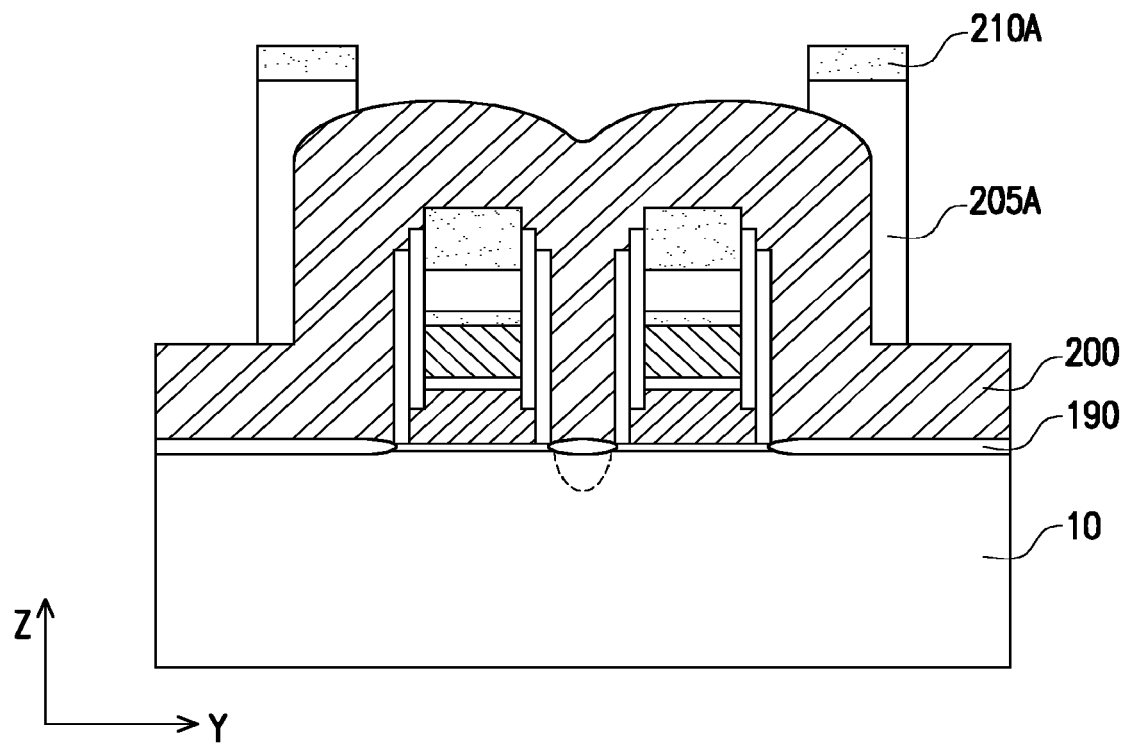
Figure 25B:
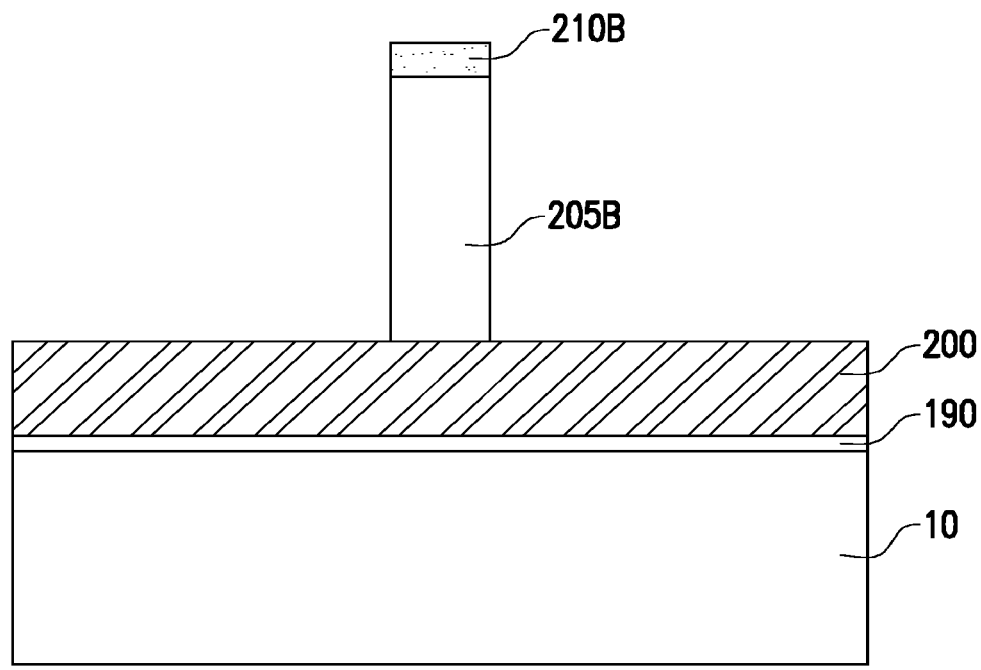

Next, as shown in FIGS. 24A and 24B, by using the resist mask patterns 215A and 215B, the second mask layer 210 is patterned by using dry etching. After the resist mask patterns are removed, the first mask layer 205 is patterned, thereby obtaining hard mask patterns 210A/205A and 210B/205B, as shown in FIGS. 25A and 25B.

Subsequently, by using hard mask patterns 210A/205A and 210B/205B as etching masks, the third conductive layer 200 is etched, thereby obtaining word lines 200A and an erase gate line 200C in the non-volatile memory area, and a gate electrode 200B in the logic circuit area.

Figure 26A:
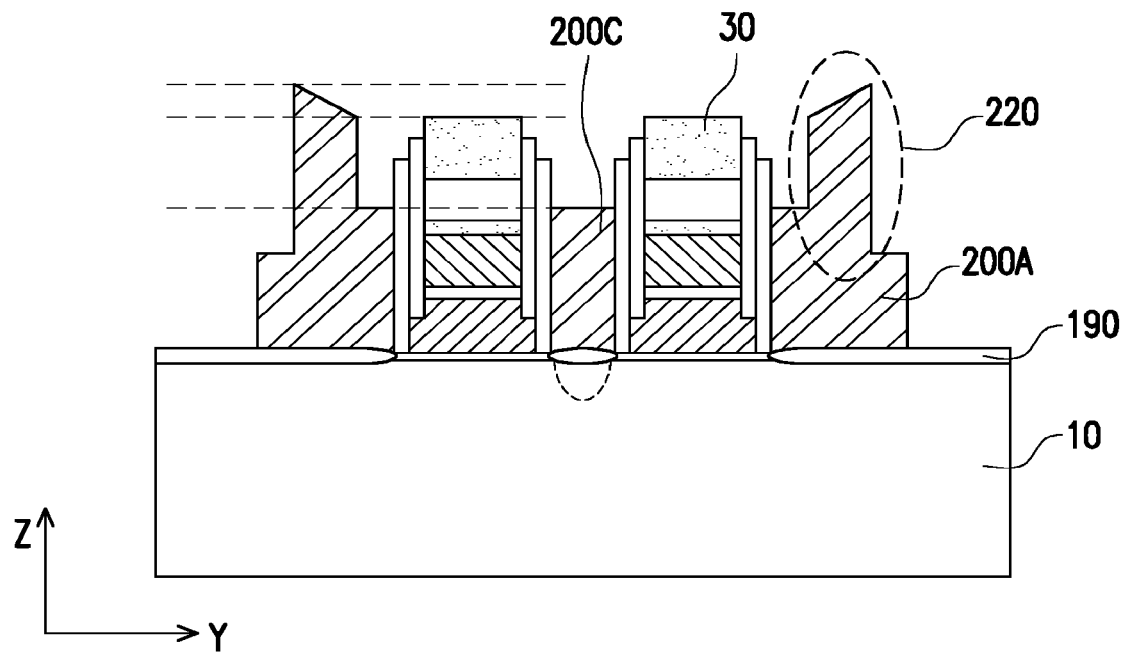
Figure 26B:
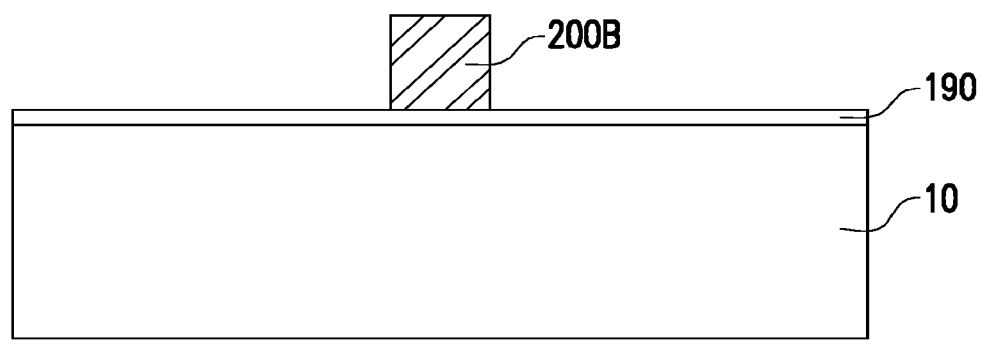

As shown in FIG. 26A, in the non-volatile memory area, the erase gate line 200C disposed between two adjacent gate stack structure 50 and word lines 200A are disposed such that one of the word lines, one of the gate stack structures, the erase gate line, the other of the gate stack structures and the other of the word lines are arranged in this order along the Y direction. At least one of the word lines includes a protrusion 220, as shown in FIG. 26A. A height of the protrusion 220 from the substrate (active region) 10 is higher than a height of the erase gate line 200C from the substrate. In certain embodiments, a height of the protrusion 220 from the substrate is higher than a height of the uppermost insulating layer 30 of the gate stack structure 50 from the substrate.

Since the word lines 200A, the erase gate line 200C and the gate pattern 200B are formed at the same time from the same polysilicon layer, the dopant concentration and polycrystalline structures thereof are substantially the same.

In other embodiments, the first mask layer 205 is a BARC layer and resist patterns 215A and 215B are formed on the BARC layer without forming the second mask layer 210. In such a case, the BARC layer is patterned by using the resist patterns and the third conductive material layer is patterned by using the patterned BARC layer.

Further in other embodiments, a thin silicon oxide or silicon nitride layer is formed between the third conductive material layer and the BARC, the thin layer is patterned by using the patterned BARC layer, and the third conductive material layer is patterned by using the patterned thin layer.

Figure 27A:
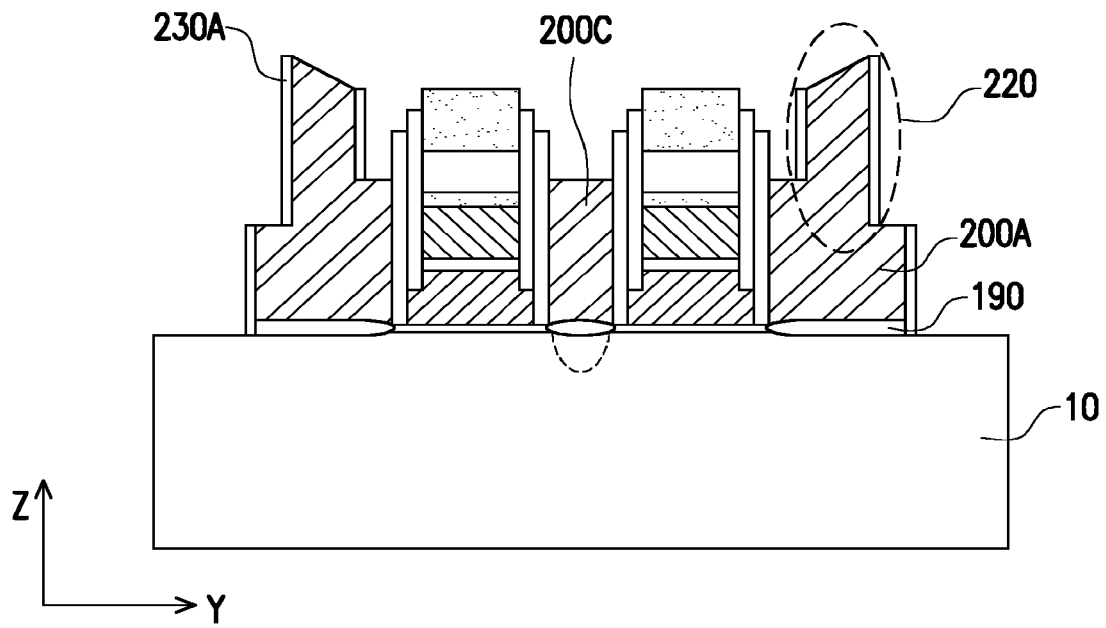
Figure 27B:
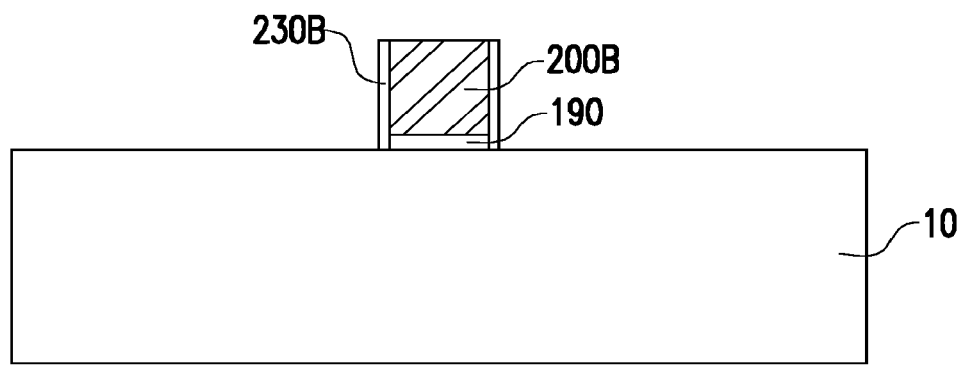

Subsequently, as shown in FIG. 27B, sidewall spacers 230B are formed on both main side faces of the gate electrode 200B in the logic circuit area. The sidewall spacers 230B include one or more layers of silicon based insulating material, such as $SiO_2$, SiN or SiON. In the non-volatile memory area, similar sidewalls 230A may be formed on side faces of the protrusion 220, as shown in FIG. 27A.

Figure 28A:
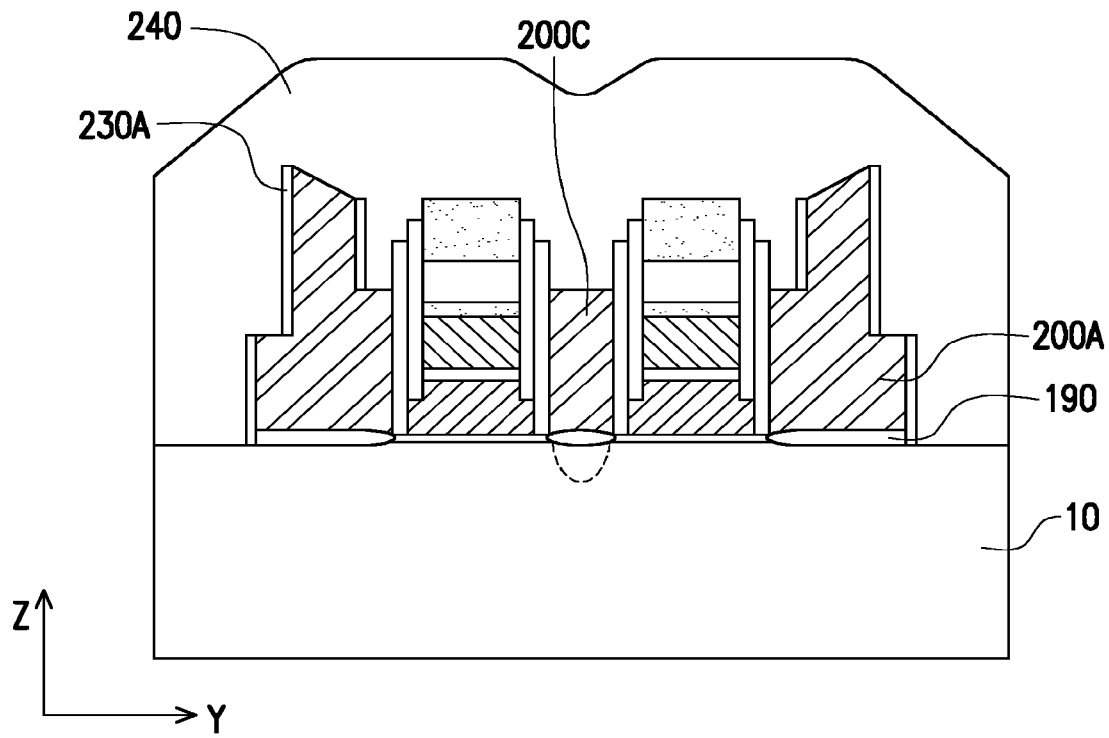
Figure 28B:
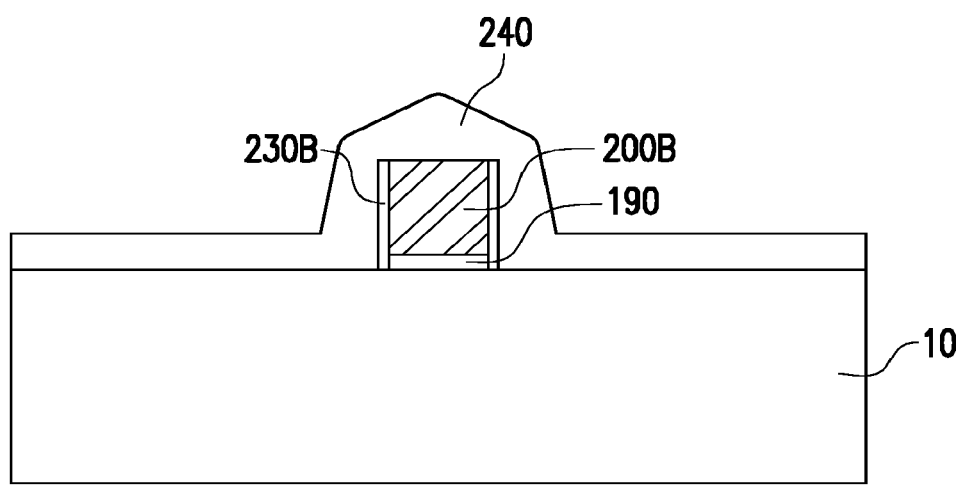

FIGS. 28A and 28B show structures after an interlayer dielectric (ILD) layer 240 is formed. The ILD layer 240 includes one or more layers of silicon based insulating material, such as $SiO_2$, SiN, SiOC, SiCN, SiOCN or SiON.

It is understood that the device shown in FIGS. 28A and 28B undergoes further CMOS processes to form various features such as interconnect metal layers, dielectric layers, passivation layers, etc.

In the embodiment of FIGS. 22A-28B, compared with the embodiments of FIGS. 12A-21B, four film deposition processes, one lithography process, one etching process and four wet processes can be eliminated. In particular, in the embodiment of FIGS. 22A-28B, after the third conductive material layer 200 is formed, only one lithography operation is performed to form a gate electrode, word lines and an erase gate line, and only one silicon oxide based material deposition and only one silicon nitride based material deposition are performed before patterning the third conductive material layer.

In the foregoing embodiments, the first to third conductive material layers are polysilicon. However, other conductive materials, such as amorphous silicon and metal materials including Cu Al, Ni, W, Ti or Ta may be used.

The various embodiments or examples described herein offer several advantages over the existing art. For example, in the present disclosure, since one lithography process can define word lines and an erase gate line in a non-volatile memory area and a gate pattern in a logic circuit area, it is possible to reduce process steps and manufacturing cost.

It will be understood that not all advantages have been necessarily discussed herein, no particular advantage is required for all embodiments or examples, and other embodiments or examples may offer different advantages.

In accordance with one aspect of the present disclosure, in a method for manufacturing a semiconductor device, a first and a second stacked structure of a non-volatile memory are formed over a substrate. A conductive material layer is formed over the first and second stacked structures. A planarization layer is formed over the conductive material layer. A mask pattern is formed over the planarization layer. The planarization layer is patterned by using the mask pattern as an etching mask. The conductive material layer is patterned, thereby forming an erase gate line between the first and second stacked structure and a first and a second word line such that the first word line, the first stacked structure, the erase gate line, the second stacked structure and the second word line are arranged in this order.

In accordance with another aspect of the present disclosure, in a method for manufacturing a semiconductor device including a non-volatile memory area and a logic circuit area, a first and a second stacked structure of a non-volatile memory are formed over the non-volatile memory area of a substrate. A conductive material layer is formed over the first and second stacked structures and over the logic circuit area of the substrate. A planarization layer is formed over the conductive material layer. A first mask pattern is formed on the planarization layer over the non-volatile memory area and a second mask pattern is formed on the planarization layer over the logic circuit area. The planarization layer is patterned by using the first and second mask patterns as an etching mask. The conductive material layer is patterned, thereby forming an erase gate line between the first and second stacked structure and a first and a second word line in the non-volatile memory area such that the first word line, the first stacked structure, the erase gate line, the second stacked structure and the second word line are arranged in this order, and forming a gate pattern in the logic circuit area.

In accordance with another aspect of the present disclosure, a semiconductor device includes a non-volatile memory and a logic circuit. The non-volatile memory includes a stacked structure comprising a first insulating layer, a floating gate, a second insulating layer, a control gate and a third insulating layer stacked in this order from a substrate; an erase gate line; and a word line. The logic circuit includes a field effect transistor comprising a gate electrode. The word line includes a protrusion, and a height of the protrusion from the substrate is higher than a height of the erase gate line from the substrate. The word line and the gate electrode are formed of polysilicon.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a non-volatile memory, wherein:
   the non-volatile memory includes:
      a stacked structure comprising a first insulating layer, a floating gate, a second insulating layer, a control gate and a third insulating layer stacked in this order from a substrate;

first sidewalls made of a first dielectric material and disposed over opposing side faces of the stacked structure;
an erase gate line; and
a word line,
an upper portion of the word line includes a first base portion, a second base portion and a protrusion disposed between the first base portion and the second base portion and protrudes upwardly from the first base portion and the second base portion, and
an upper portion of one of the first sidewalls located at a word line side is exposed from the word line.

2. The semiconductor device of claim 1, wherein a height of the protrusion from the substrate is higher than a height of the erase gate line from the substrate.

3. The semiconductor device of claim 1, wherein:
the stacked structure further includes second sidewalls made of a second dielectric material and disposed over opposing side faces of the stacked structure such that the second sidewalls are located between the first sidewalls and the stacked structure, and
a height of one of the second sidewalls located the word line side is higher than a height of the one of the first sidewalls located at the word line side.

4. The semiconductor device of claim 3, wherein:
the second sidewalls are disposed on opposite side faces of the control gate and the third insulating layer, and
the first sidewalls are disposed on opposite side faces of the floating gate.

5. The semiconductor device of claim 1, wherein:
a height of the first base portion is different from a height of the second base portion.

6. The semiconductor device of claim 5, wherein:
the second base portion is disposed closer to the erase gate than the first base portion, and
the height of the first base portion is smaller than the height of the second base portion.

7. The semiconductor device of claim 5, wherein a third sidewall made of an insulating material is disposed on a side face of the first base portion.

8. The semiconductor device of claim 7, wherein fourth sidewalls made of the insulating material are disposed on opposite side faces of the protrusion.

9. The semiconductor device of claim 7, wherein the third sidewall and one of the fourth sidewalls of the protrusion located closer to the first base portion than the second base portion are discontinuous.

10. The semiconductor device of claim 1, wherein an upper surface of the protrusion inclines downward toward the stacked structure.

11. The semiconductor device of claim 1, wherein a height of the protrusion from the substrate is higher than a height of the control gate from the substrate.

12. A semiconductor device including a non-volatile memory, wherein:
the non-volatile memory includes:
a first stacked structure and a second stacked structure, each comprising a first insulating layer, a floating gate, a second insulating layer and a control gate stacked in this order from a substrate;
first sidewalls disposed over opposing side faces of the first stacked structure;
second sidewalls disposed over opposing side faces of the second stacked structure;
an erase gate line disposed between the first stacked structure and the second stacked structure; and
a first word line and a second word line disposed such that the first stacked structure is disposed between the first word line and the erase gate line and the second stacked structure is disposed between the second word line and the erase gate line,
an upper portion of the first word line includes a first base portion and a second base portion and a first protrusion disposed between the first base portion and the second base portion and protrudes upwardly from the first base portion and the second base portion,
an upper portion of one of the first sidewalls located at a first word line side is exposed from the first word line, and
an upper portion of one of the second sidewalls located at a second word line side is exposed from the second word line.

13. The semiconductor device of claim 12, wherein a height of the first protrusion from the substrate is higher than a height of the erase gate line from the substrate.

14. The semiconductor device of claim 12, wherein the first protrusion includes sidewall spacers made of an insulating material.

15. The semiconductor device of claim 12, wherein:
an upper portion of the second word line includes a third base portion, a fourth base portion and a second protrusion disposed between the third base portion and the fourth base portion and protrudes upwardly from the third base portion and the fourth base portion,
a height of the first base portion is different from a height of the second base portion, and
a height of the third base portion is different from a height of the fourth base portion.

16. The semiconductor device of claim 15, wherein:
the second base portion is disposed closer to the erase gate than the first base portion,
the height of the first base portion is smaller than the height of the second base portion,
the fourth base portion is disposed closer to the erase gate than the third base portion, and
the height of the third base portion is smaller than the height of the fourth base portion.

17. The semiconductor device of claim 15, wherein a third sidewall made of an insulating material is disposed on a side face of the first base portion.

18. The semiconductor device of claim 17, wherein:
fourth sidewalls made of the insulating material are disposed on opposite side faces of the first protrusion, and
the third sidewall and one of the fourth sidewalls located closer to the first base portion are discontinuous.

19. The semiconductor device of claim 12, wherein an upper surface of the first protrusion inclines downward toward the stacked structure.

20. A semiconductor device including a non-volatile memory and a logic circuit, wherein:
the non-volatile memory includes:
a stacked structure comprising a first insulating layer, a floating gate, a second insulating layer, a control gate and a third insulating layer stacked in this order from a substrate;
first sidewalls made of a first dielectric material and disposed over opposing side faces of the stacked structure;
an erase gate line; and
a word line,
the logic circuit includes a field effect transistor comprising a gate electrode, the word line includes a first base portion, a second base portion and a protrusion disposed between the first base portion and the second base portion and protrudes upwardly from the first base portion and the second base portion, an upper portion of one of the first sidewalls located at a word line side is exposed from the word line, and the word line and the gate electrode are formed of polysilicon.

* * * * *